(12) United States Patent
Nakadaira

(10) Patent No.: US 9,171,895 B2
(45) Date of Patent: Oct. 27, 2015

(54) DISPLAY AND METHOD OF MANUFACTURING THE SAME

(75) Inventor: Tadakatsu Nakadaira, Kanagawa (JP)

(73) Assignee: Joled Inc., Tokyo (JP)

( * ) Notice: Subject to any disclaimer, the term of this patent is extended or adjusted under 35 U.S.C. 154(b) by 0 days.

(21) Appl. No.: 13/566,113

(22) Filed: Aug. 3, 2012

(65) Prior Publication Data

US 2013/0048991 A1    Feb. 28, 2013

(30) Foreign Application Priority Data

Aug. 22, 2011  (JP) ................. 2011-180778

(51) Int. Cl.
| | |
|---|---|
| *H01L 31/00* | (2006.01) |
| *H01L 27/32* | (2006.01) |
| *H01L 27/12* | (2006.01) |
| *H01L 23/552* | (2006.01) |

(52) U.S. Cl.
CPC ........ *H01L 27/3272* (2013.01); *H01L 27/1225* (2013.01); *H01L 23/552* (2013.01); *H01L 2924/0002* (2013.01)

(58) Field of Classification Search
USPC .................. 257/2–4, 59, 72, 43, 58; 365/148
See application file for complete search history.

(56) References Cited

U.S. PATENT DOCUMENTS

| | | | | |
|---|---|---|---|---|
| 7,589,801 | B2 * | 9/2009 | Yoon ............................... | 349/43 |
| 8,183,562 | B2 * | 5/2012 | Im et al. ........................... | 257/40 |
| 8,362,487 | B2 * | 1/2013 | Yamazaki et al. ............... | 257/72 |
| 8,421,084 | B2 * | 4/2013 | Kang et al. ....................... | 257/72 |
| 2007/0080377 | A1 * | 4/2007 | Sung et al. ..................... | 257/253 |
| 2007/0228382 | A1 * | 10/2007 | Yamazaki et al. ............... | 257/72 |
| 2010/0096633 | A1 * | 4/2010 | Hatano et al. ................... | 257/59 |
| 2011/0111543 | A1 * | 5/2011 | Ono ................................. | 438/42 |

FOREIGN PATENT DOCUMENTS

| | | |
|---|---|---|
| JP | 2007-115902 | 5/2007 |
| JP | 2007-150157 | 6/2007 |
| JP | 2009-224354 | 10/2009 |

* cited by examiner

*Primary Examiner* — Cheung Lee
*Assistant Examiner* — Frederick B Hargrove
(74) *Attorney, Agent, or Firm* — K&L Gates LLP

(57) ABSTRACT

A display, a method of manufacturing the display, and an electronic apparatus are provided. The display includes a resin, a transistor; and a light shielding material positioned between the resin and the transistor. The light shielding material is configured to suppress an incidence of light on the transistor. Light is prevented from entering an oxide semiconductor layer to be used as an active layer so as to suppress deterioration of transistor characteristics.

19 Claims, 15 Drawing Sheets

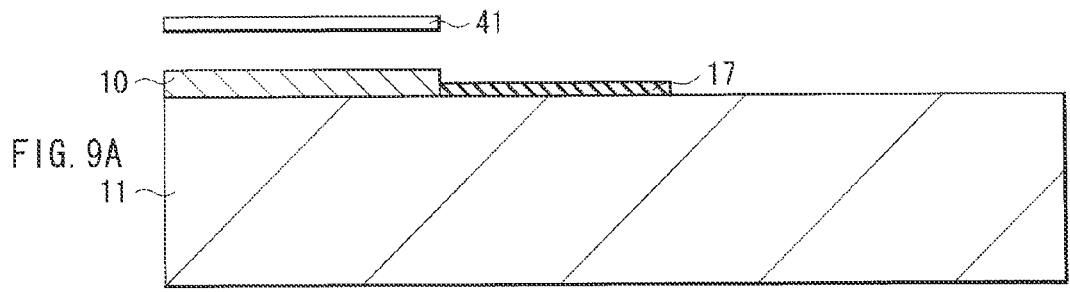
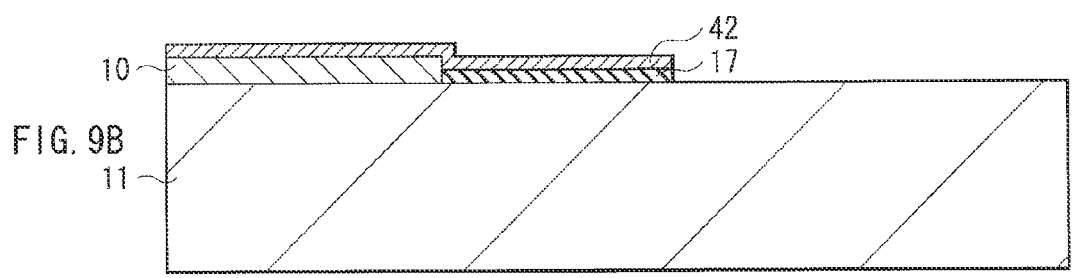
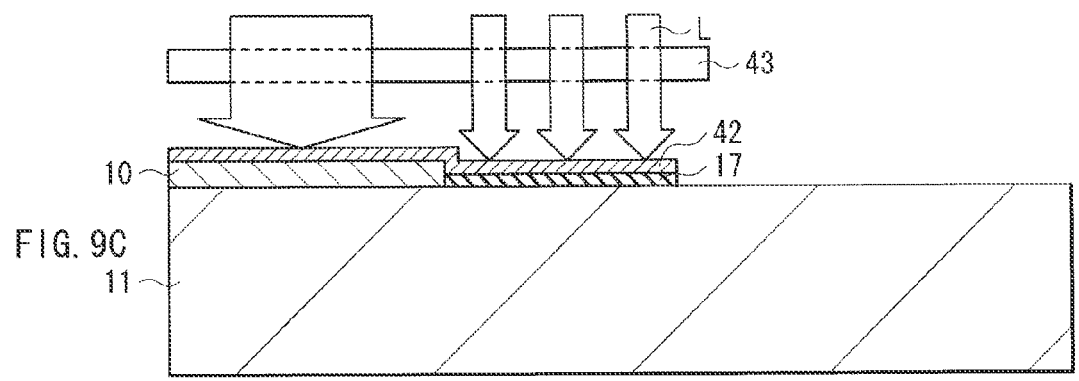
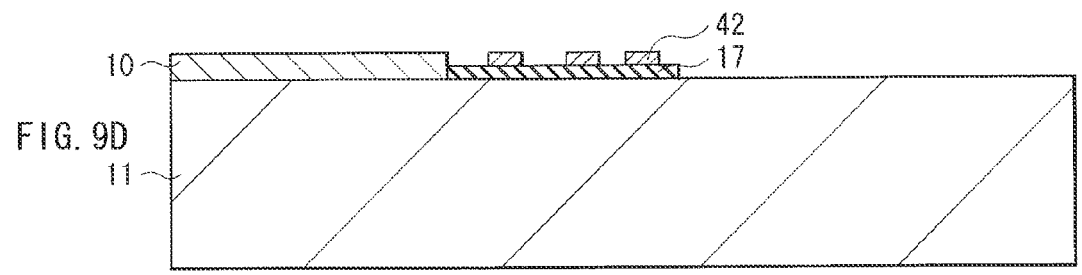

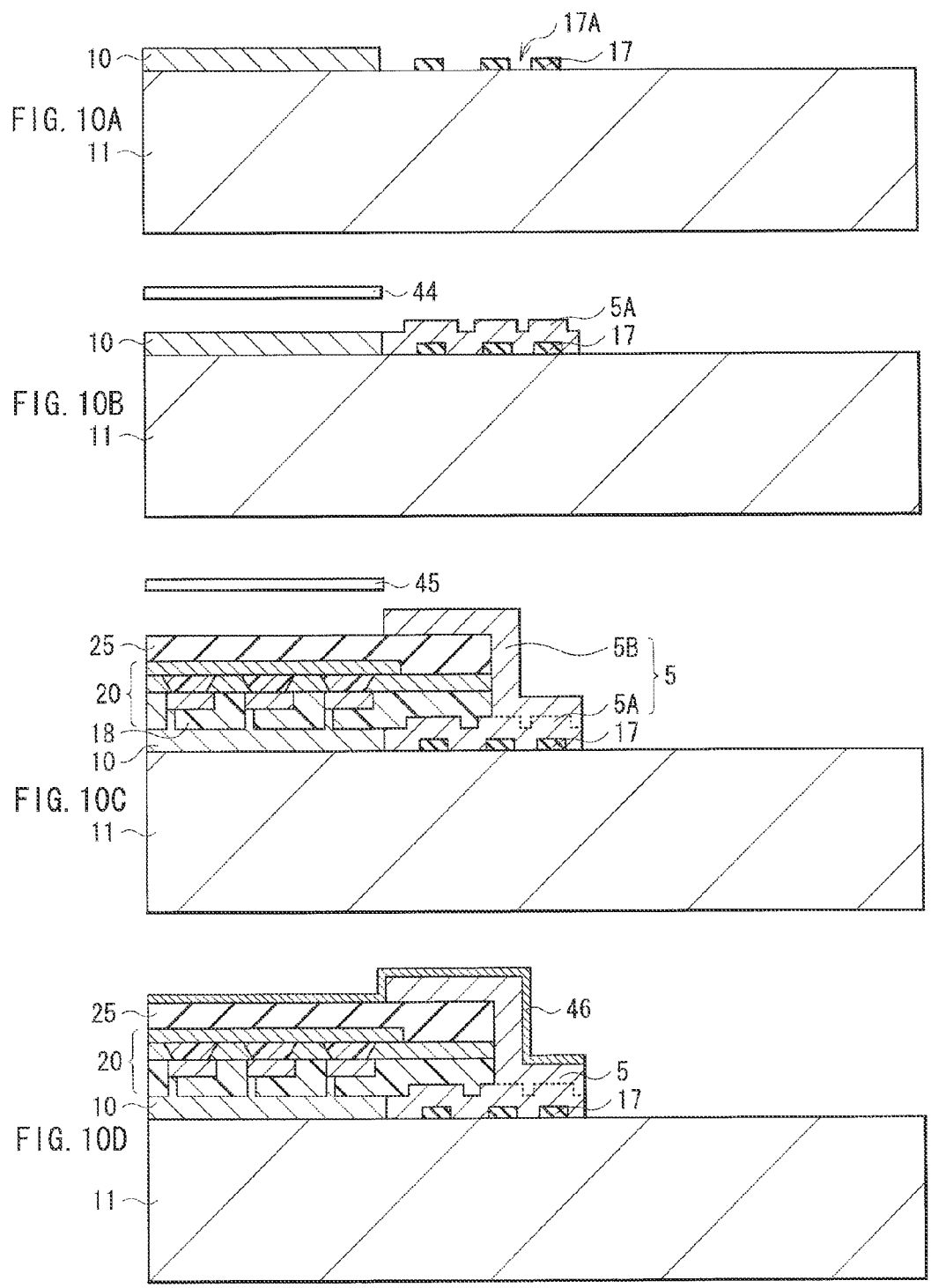

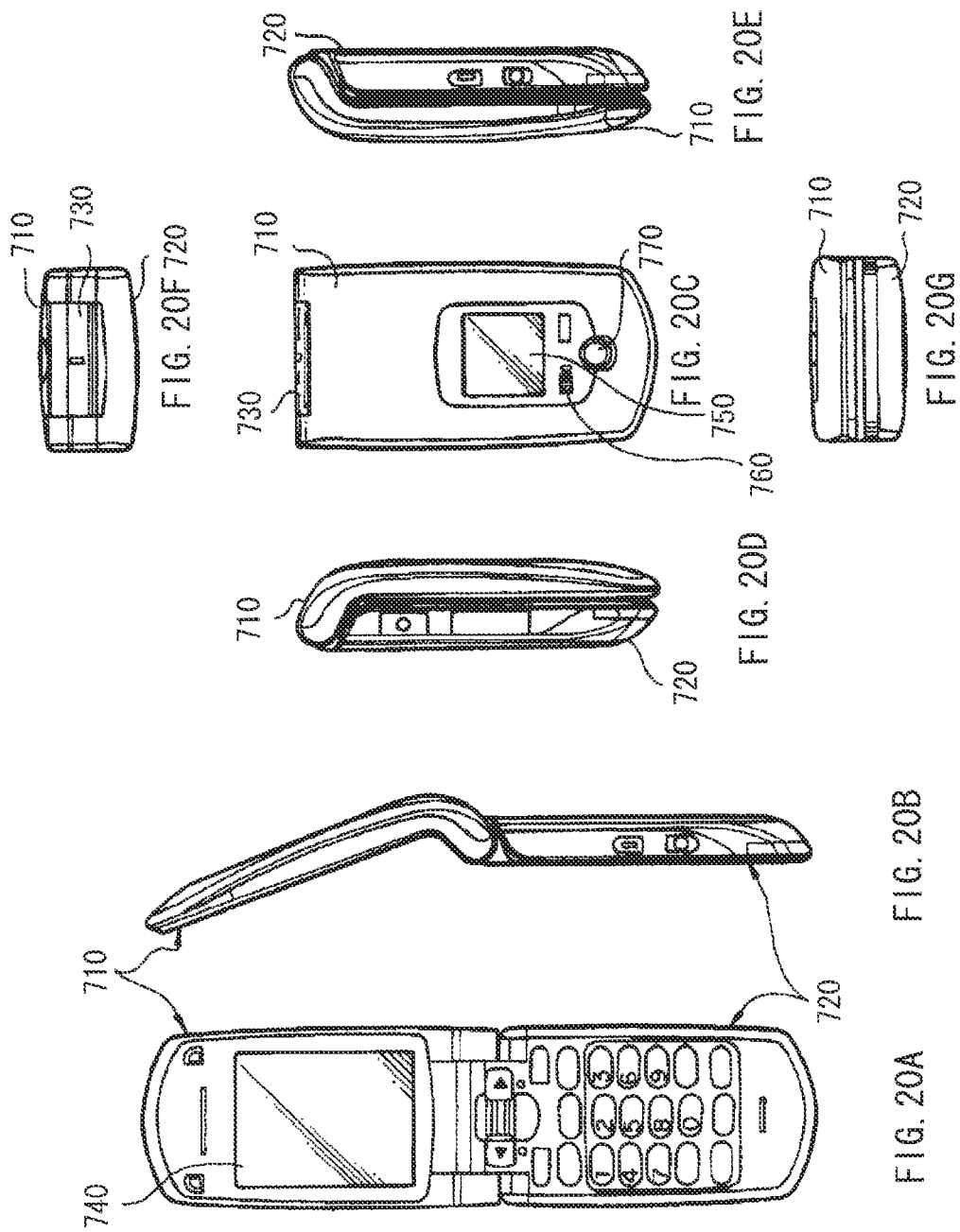

DISPLAY AND METHOD OF MANUFACTURING THE SAME

CROSS REFERENCES TO RELATED APPLICATIONS

The present application claims priority to Japanese Patent Application No. 2011-180778 filed on Aug. 22, 2011, the disclosure of which is incorporated herein by reference.

BACKGROUND

The present disclosure relates to a display employing a thin film transistor (TFT) in which an active layer is made of an oxide semiconductor and a method of manufacturing the display.

TFTs are widely applied, as a basic technology, to liquid crystal displays, organic EL displays, and the like. Generally, a semiconductor layer serving as an active layer of a TFT is made of amorphous silicon (a-Si:H) or poly silicon, but in recent years, oxide semiconductors such as metal oxides which may be formed by inexpensive apparatuses adopting a sputtering method or the like are also used to form such a semiconductor layer. However, if light (especially ultraviolet light of 420 nm or less) is irradiated on a semiconductor layer made of an oxide semiconductor, its TFT characteristics may be varied by photoinduction, or more specifically, its threshold level voltage (Vth) may be shifted to negative (−) direction.

In order to solve this issue, for example, Japanese Unexamined Patent Application Publication No. 2007-115902 discloses a TFT employing a light shielding film provided on the rear face of a substrate. In addition, for example, Japanese Unexamined Patent Application Publication No. 2009-224354 discloses a bottom-gate type TFT employing a light-absorbing layer provided between a gate electrode and an active layer, and Japanese Unexamined Patent Application Publication No. 2007-150157 discloses a TFT employing a base material (substrate) made of a material in which transmittance of light having a wavelength shorter than the band gap energy is 10% or less.

SUMMARY

With the above-mentioned TFTs disclosed in Japanese Unexamined Patent Application Publication Nos. 2007-115902, 2009-224354, and 2007-150157, light incident on an active layer from a rear side of a substrate may be shielded; however, light irradiated from a side direction of the substrate may not be sufficiently shielded. In recent years, narrower frame is desired in displays, especially in mobile displays, and the distance between a terminal section provided in a peripheral region (frame region) and pixels provided in a display region (pixel region) is significantly shortened. Under this circumstance, there is an issue that light irradiated from a frame region side, that is, an oblique direction enters a semiconductor layer (oxide semiconductor layer) of a TFT, leading to deteriorated TFT characteristics.

It is desirable to provide a display and electronic apparatus which prevent light from entering an oxide semiconductor layer to be used as an active layer so as to suppress deterioration of TFT characteristics, and a method of manufacturing the display.

According to an embodiment of the present technology, there is provided a display including a resin, a transistor; and a light shielding material positioned between the resin and the transistor. The light shielding material is configured to suppress an incidence of light on the transistor.

According to an embodiment of the present technology, there is provided a method of manufacturing a display. The method includes forming a resin, a transistor, and a light shielding material. The light shielding material is positioned between the resin and the transistor, and the light shielding material is configured to suppress an incidence of light on the thin film transistor.

According to an embodiment of the present technology, there is provided an electronic apparatus including a resin, a transistor; and a light shielding material positioned between the resin and the transistor. The light shielding material is configured to suppress an incidence of light on the transistor.

In the display, the method of manufacturing the display, and the electronic apparatus according to the embodiments of the present technology, after the thin film transistor and the light emitting device are formed, the side face of the thin film transistor, the side face of the light emitting device, and a part of the top face of the light emitting device are covered by the light shielding film. In this way, light coming from an oblique direction, especially from a frame region side, to enter the thin film transistor is shielded. Furthermore, since the side face of the thin film transistor, the side face of the light emitting device, and a part of the top face of the light emitting device are covered by the light shielding film, it is possible to shield light coming from an oblique direction, especially from a frame region side, and it is thus possible to suppress deterioration of characteristics of the thin film transistor.

It is to be understood that both the foregoing general description and the following detailed description are exemplary, and are intended to provide further explanation of the technology as claimed Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

FIGS. 9A to 9D are sectional views showing the manufacturing method illustrated in FIG. 8 in the order of processes.

FIGS. 10A to 10D are sectional views showing processes subsequent to the process of FIG. 9D.

FIG. 20A is a front elevational view of application example 5 in an unfolded state, FIG. 20B is a side view thereof, FIG. 20C is a front elevational view in a folded state, FIG. 20D is a left side view, FIG. 20E is a right side view, FIG. 20F is a top view, and FIG. 20G is a bottom view.

DETAILED DESCRIPTION

Embodiments of the present application will be described below in detail with reference to the drawings.

Referring to the figures, an embodiment of the present disclosure will be described in detail. It is to be noted that description will be given in the following order.
1. Embodiment
1-1. General Configuration
1-2. General Configuration of Display
1-3. Manufacturing Method
2. Application Example

1. EMBODIMENT 1-1. General Configuration

Figure 1:
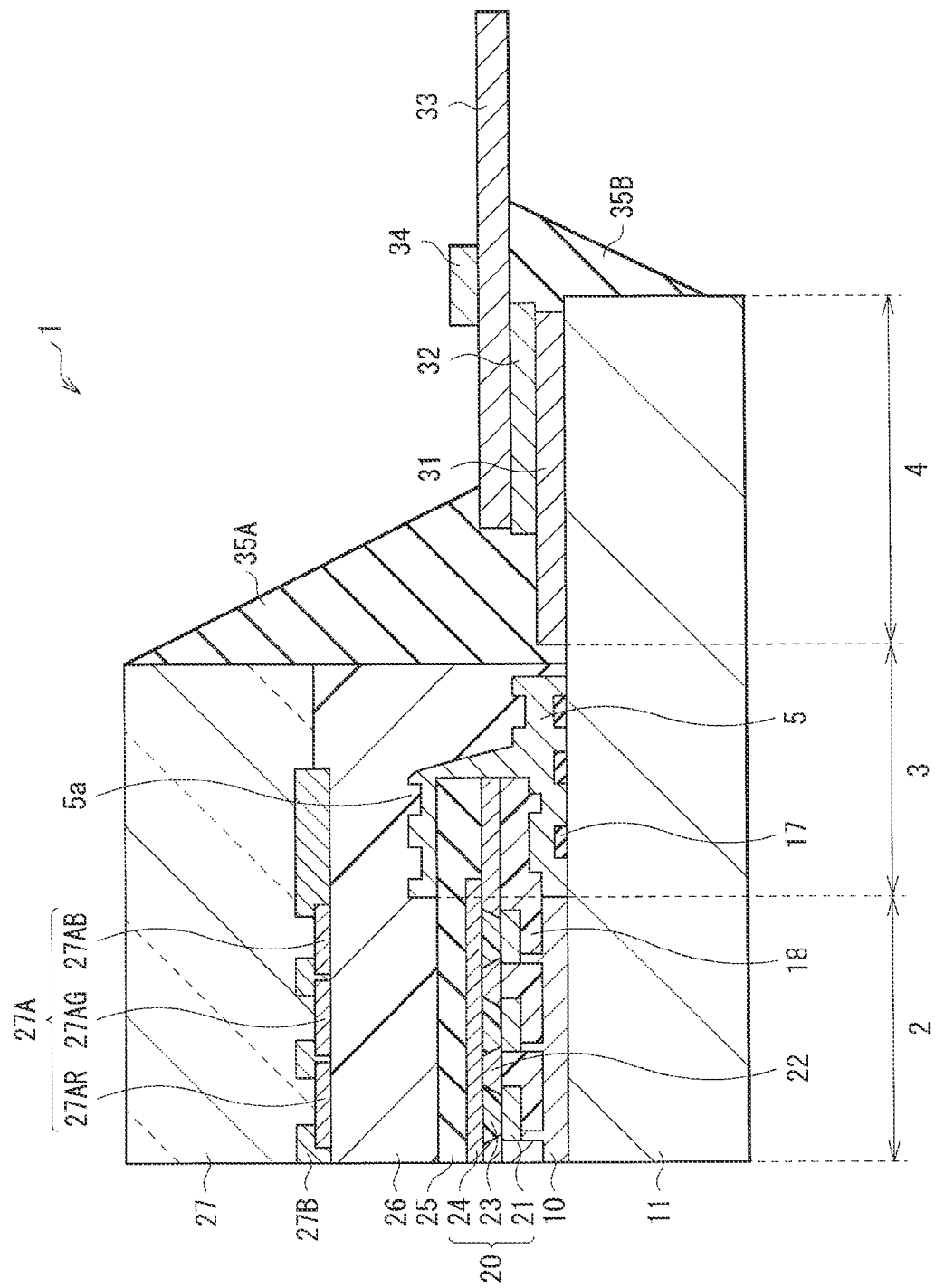
FIG. 1 is a sectional view showing an exemplary configuration of a display according to an embodiment of the present disclosure.

FIG. 1 shows a cross-sectional configuration of a part of a display 1 according to an embodiment of the present disclosure. In the display 1, on a pixel region 2 of a substrate 11, a plurality of pixels (not shown) is disposed in matrix (grid). The pixels include red pixels R, green pixels G, and blue pixels B, which are disposed on a color by color basis in a line shape. Each of the pixels (R, G, and B) is provided with an organic EL device 20 (light emitting device) which outputs a corresponding color. Each organic EL device 20 is formed on a thin film transistor (TFT) 10 for driving devices. It is to be noted that, in this instance, a combination of the red pixel R, the green pixel G, and the blue pixel B configures one display pixel (pixel). A frame region 3 is provided at the periphery of the pixel region 2, and a terminal section 4 is provided at a peripheral portion of the frame region 3.

Figure 2A:
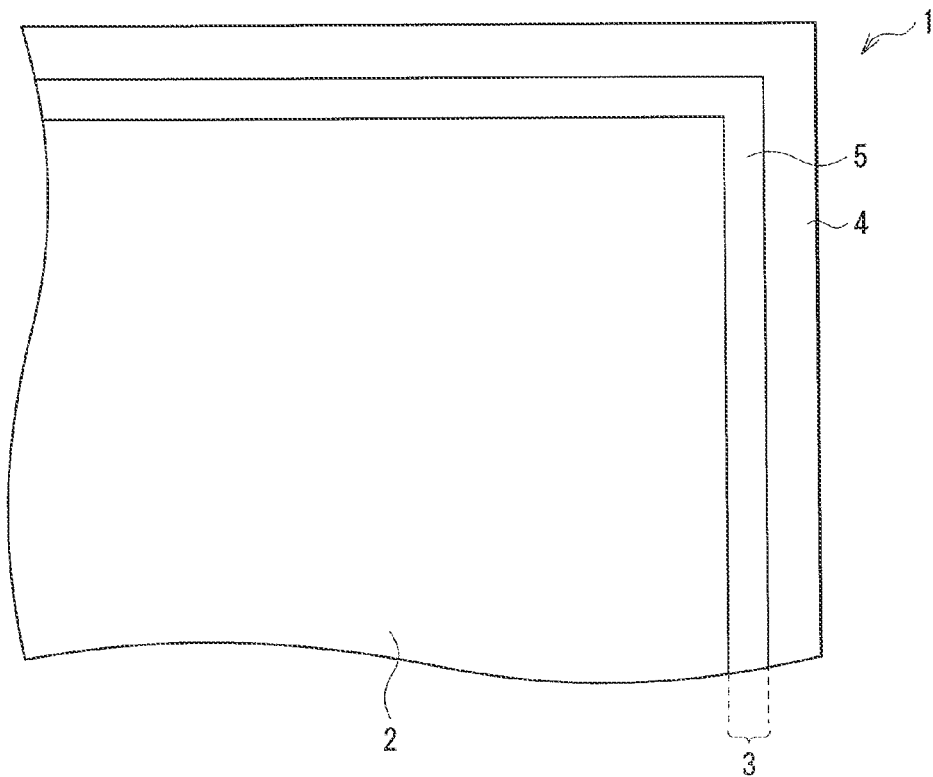
FIGS. 2A and 2B are plan views of the display illustrated in FIG. 1.

In the display 1 of the present embodiment, a light shielding film 5 is provided in the frame region 3 (between the pixel region 2 and the terminal section 4) as illustrated in FIG. 1 and FIG. 2A. The light shielding film 5 is made of a material having a light shielding function by scattering or absorbing light, especially light having a wavelength of 420 nm or less (ultraviolet light). The light shielding film 5 is formed so as to cover side faces of the TFT 10 and the organic EL device 20 provided in the pixel region 2 and a part of the top face of the organic EL device 20. Thus, in the manufacturing process of the display 1 described later, incidence of ultraviolet (UV) light, which is outputted at the time of providing damp-proof reinforcing materials 35A and 35B to the terminal section 4, on the TFT 10 may be suppressed. In the present embodiment, the light shielding film 5 (5A and 5B; see FIG. 10) is provided, not only on the side face of the TFT 10, the side face of the organic EL device 20, and a part of the top face of the organic EL device 20, but also on a layer formed extending from the end portion of the TFT 10 and configuring the organic EL device 20, in such a manner as to sandwich the organic EL device 20. It should be noted that this is not limitative, and, for example, the above-described incidence of UV light on the TFT 10 may be suppressed if the light shielding film 5 is provided so as to cover at least part of the top face and the side face of the organic EL device 20, and further the extended line from the side face of the organic EL device 20 to the substrate 11.

Figure 2B:
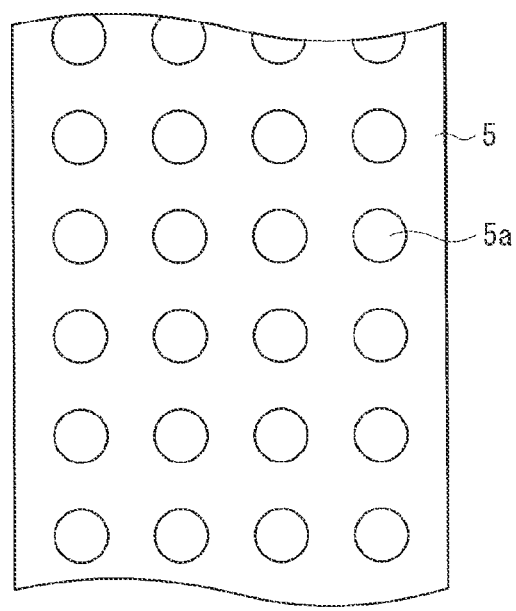

In addition, as illustrated in FIG. 2B, one or more recessed portions 5a are provided on the surface of the light shielding film 5 in the present embodiment (on the substrate 11 and the top face of the organic EL device 20, see FIG. 1). By providing this recessed portion 5a, in addition to the light shielding function for UV light offered by the characteristics of the material configuring the light shielding film 5, a reflecting function offered by the form (or the recessed portion 5a) is added, and thus UV light incident on the TFT 10 from an oblique direction is shielded more securely. Concrete examples of the material for configuring the light shielding film 5 are titanium oxide ($TiO_2$), and zinc oxide (ZnO). General metals such as Aluminum (Al), Copper (Cu), Tungsten (W), Gold (Au), Tantalum (Ta), Cobalt (Co), and silicides thereof may also be used as the light shielding film 5. Barrier metals such as titanium nitride (TiN) and tantalum nitride (TaN) may also be used. Other materials may also be used as long as the above-described light shielding function for UV light is obtained. In addition, the light shielding film 5 may include materials other than those having the light shielding function.

Figure 3A:
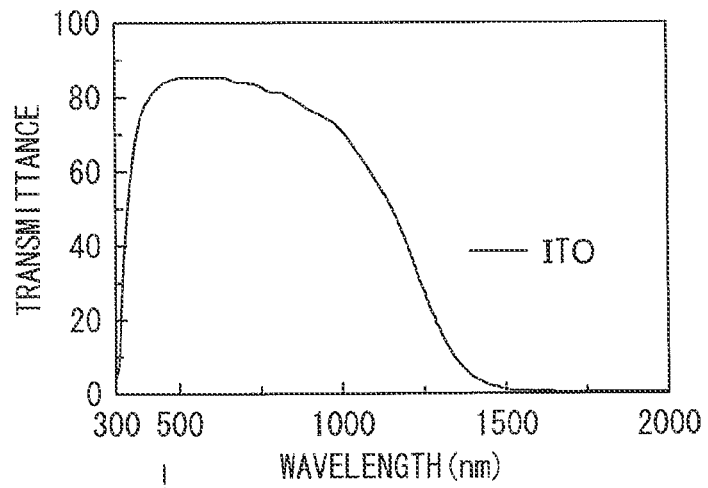
FIGS. 3A to 3C are characteristic diagrams showing ultraviolet ray (UV) transmittance of materials.
Figure 3B:
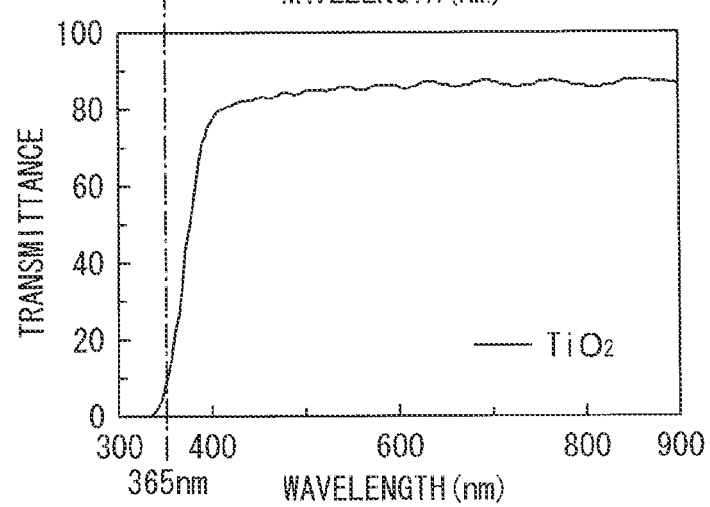
Figure 3C:
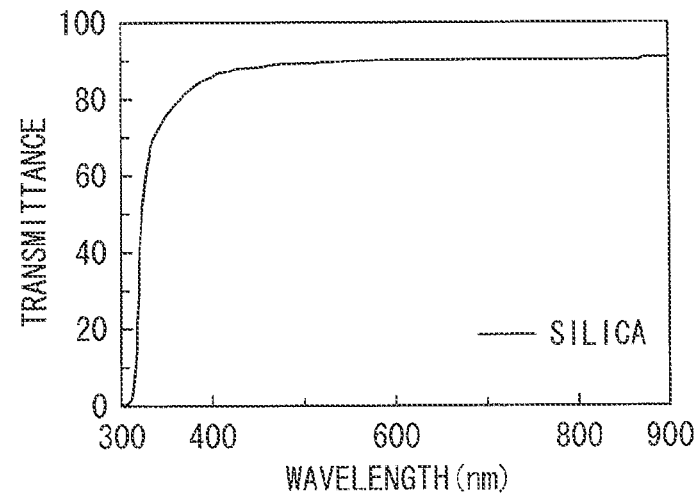
Figure 4:
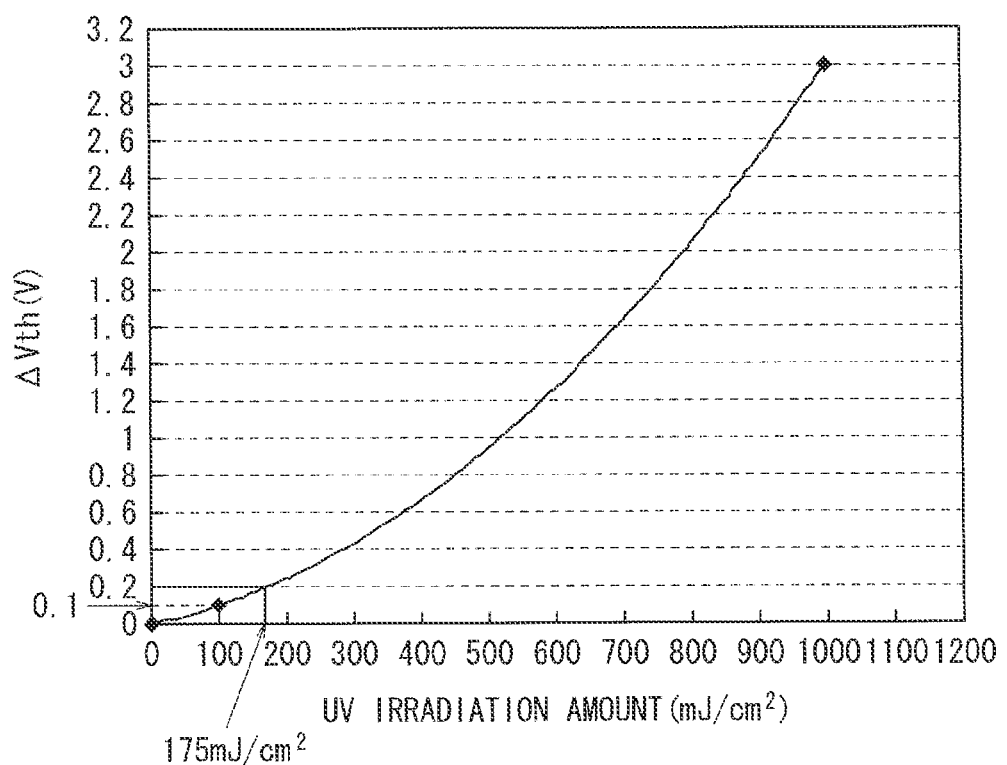
FIG. 4 is a characteristic diagram showing a relationship between UV irradiation amount and threshold level.

The film thickness of the light shielding film 5 is preferably 380 nm or more. For example, as illustrated in FIGS. 3A to 3C, $TiO_2$ (FIG. 3B) has a function to shield light in the ultraviolet region as compared with ITO (FIG. 3A) and silica (FIG. 3C). Specifically, when the film thickness is 500 nm, UV light shielding capability of 90% is obtained. Since the irradiation amount of UV light in the case where the above-described damp-proof reinforcing material is cured is typically about 1000 $mJ/cm^2$, when light is shielded by a $TiO_2$ film having a film thickness of 500 nm, about 10% (100 $mJ/cm^2$) of UV light is allowed to pass therethrough. FIG. 4 shows a relationship between the UV irradiation amount and the amount of variation ($\Delta Vth$) of the threshold level (Vth) of the TFT 10 after UV irradiation. As shown in FIG. 4, when UV light of 100 $mJ/cm^2$ is irradiated, the threshold level (Vth) is shifted by about 0.1 V. Generally, acceptable $\Delta Vth$ of a TFT is 0.2 V or less. Referring to FIG. 4, $\Delta Vth$ becomes 0.2 V when the UV irradiation amount is 175 $mJ/cm^2$. On the other hand, intensity L of transmitting light in the case where the intensity of UV incident light is represented by $L_0$ has a relationship of $L(t)=L_0 \times \eta^t$, where transmittance per unit length (film thickness) is represented by $\eta$. It is assumed that the intensity of incident light $L_0$ is the UV irradiation amount (1000 $mJ/cm^2$) which is applied on the damp-proof reinforcing materials 35A and 35B when they are cured, and transmittance $\eta$ per unit length (film thickness) is the transmittance corresponding to the film thickness of 500 nm, that is, $\eta=10\%=0.1$. In addition, if intensity L(t) of transmitting light is acceptable $\Delta Vth$ (0.2 V) of a TFT, then $175=1000\times 0.1^{(t/500)}$, and t=378.5 nm. Specifically, the film thickness of the light shielding film 5 for effectively suppressing incidence of UV light on the TFT 10 is preferably 378.5 nm or more, and more preferably, 380 nm or more.

1-2. General Configuration of Display

Figure 5:
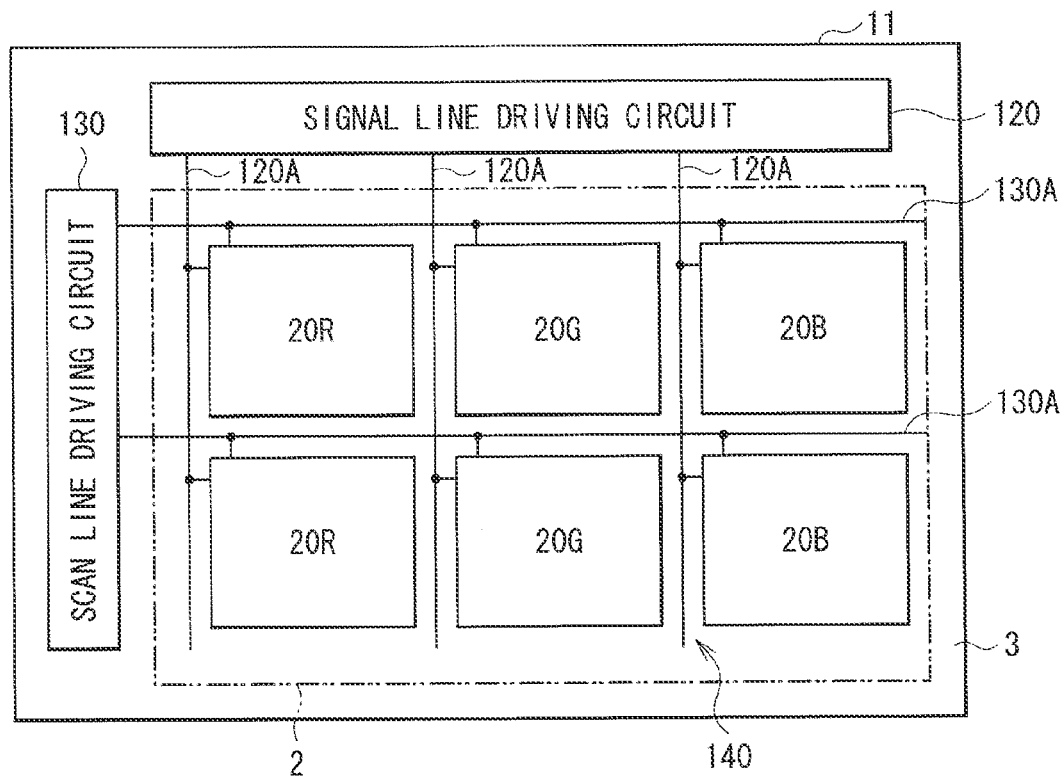
FIG. 5 is a block diagram of the display illustrated in FIG. 1.

Next, the cross-sectional configuration of the display 1 is described. FIG. 5 shows a block configuration of the display 1 according to the present embodiment. The display 1 is used as, for example, an organic EL television or the like. As described above, the pixel region 2 in which a plurality of the organic EL devices 20 (20R, 20G, and 20B) are disposed in matrix is formed on the substrate 11, and the frame region 3 is disposed in such a manner as to surround the pixel region 2. The frame region 3 is provided with a signal line driving circuit 120 and a scan line driving circuit 130 as drivers for image display.

Figure 6:
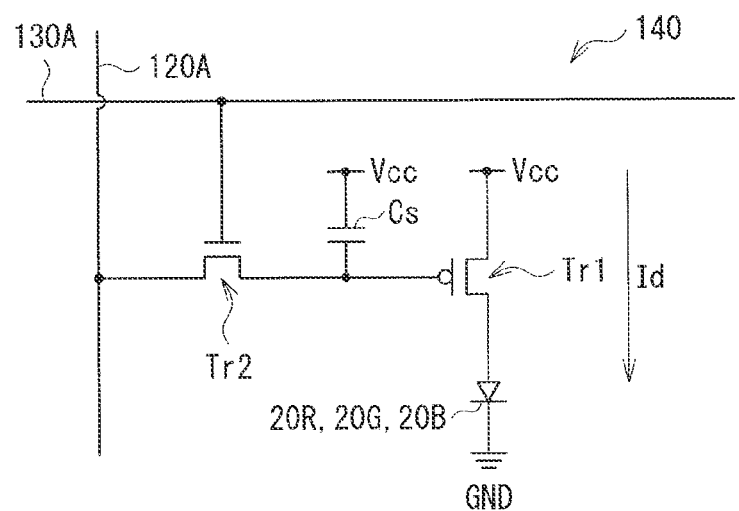
FIG. 6 is a diagram showing an exemplary pixel driving circuit of the display illustrated in FIG. 5.

In the pixel region 2, a pixel driving circuit 140 is provided. FIG. 6 shows an example of the pixel driving circuit 140. The pixel driving circuit 140 is an active-type driving circuit formed in a lower layer of a lower electrode 21 described later. In other words, the pixel driving circuit 140 includes a driving transistor Tr1, a writing transistor Tr2, a capacitor Cs provided between the transistors Tr1 and Tr2, and the red organic EL device 20R (or the green organic EL device 20G, or the blue organic EL device 20B) connected in series to the driving transistor Tr1 between a first power-source line (Vcc) and a second power-source line (GND). Each of the driving transistor Tr1 and the writing transistor Tr2 is configured of a common TFT, and the configuration thereof is not specifically limited, and may be either of, an inversely-staggered structure (so-called bottom-gate type) or a staggered structure (top-gate type), for example.

In the pixel driving circuit 140, a plurality of signal lines 120A are disposed in the column direction, and a plurality of scan lines 130A are disposed in the row direction. Each intersection between the signal line 120A and the scan line 130A corresponds to one of the red organic EL device 20R, the green organic EL device 20G, and the blue organic EL device 20B. The signal lines 120A are connected to the signal line driving circuit 120, and an image signal is supplied from the signal line driving circuit 120 to a source electrode of the writing transistor Tr2 through the signal line 120A. The scan lines 130A are connected to the scan line driving circuit 130, and a scanning signal is sequentially supplied from the scan line driving circuit 130 to a gate electrode of the writing transistor Tr2 through the scan line 130A.

Figure 7:
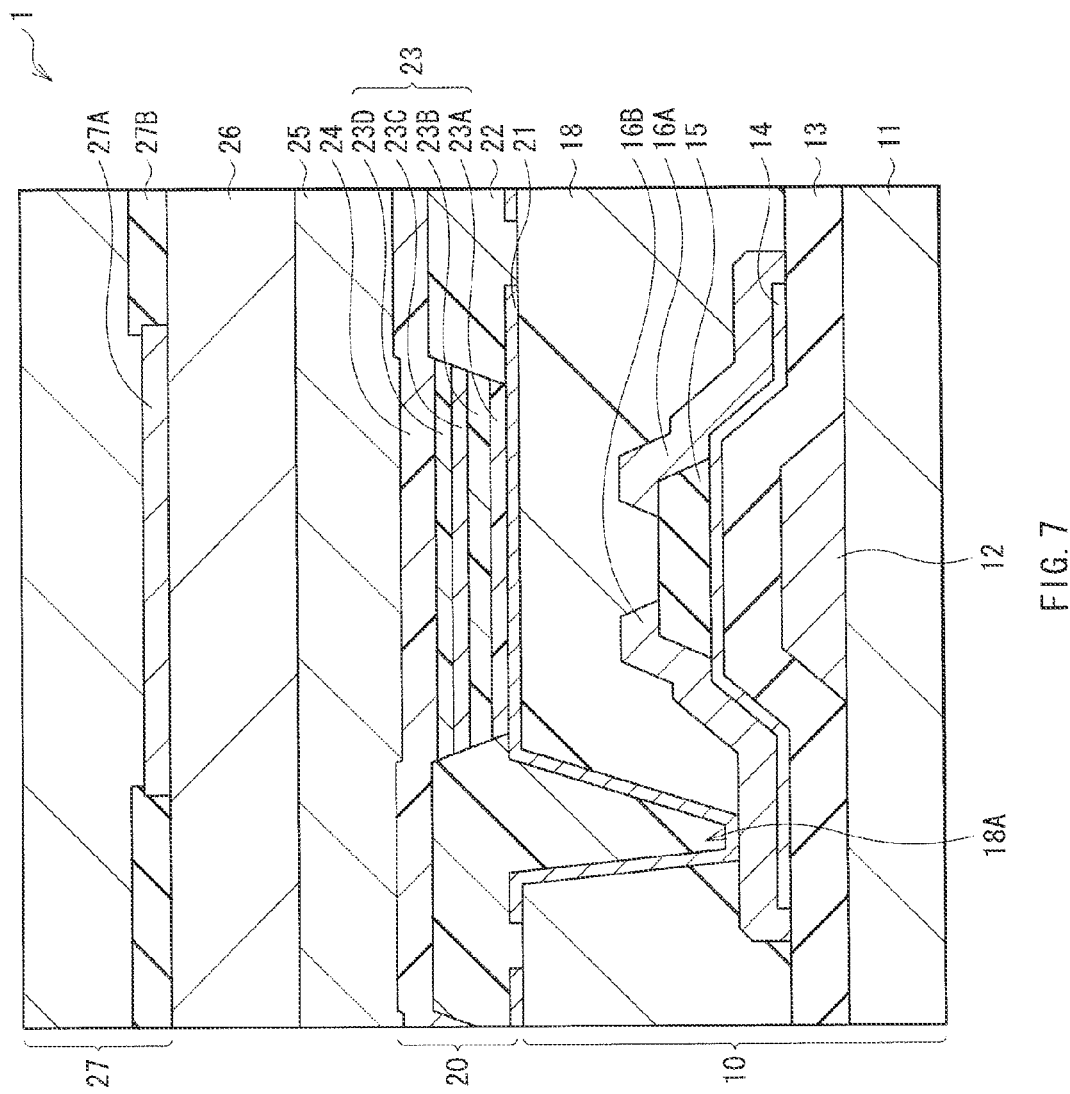
FIG. 7 is a sectional view showing a part of the display illustrated in FIG. 1.

FIG. 7 shows a cross-sectional configuration of a part of the display 1. In the display 1, the TFT 10 which is driven by, for example, the active matrix system is provided on the substrate 11, and the organic EL device 20 (20R, 20G, and 20B) which includes a light emitting layer 23C corresponding to the pixel (R, G, and B) is provided on the TFT 10.

TFT

The TFT 10 is a TFT of a so-called bottom-gate type, and its channel (active layer) is made of, for example, an oxide semiconductor. In the TFT 10, a gate electrode 12, a gate insulating film 13, an oxide semiconductor layer 14, a channel protect film 15, and a source/drain electrodes 16A and 16B are formed in this order on the substrate 11 made of glass or the like. A planarizing film 18 configured to planarize the irregularities of the TFT 10 over the entire face of the substrate 11 is formed on the source electrode 16A and the drain electrode 16B.

The gate electrode 12 plays a role in controlling the career density (here, electron density) in the oxide semiconductor layer 14 by a gate voltage applied to the TFT 10. The gate electrode 12 is configured of a single layer film made of one of molybdenum (Mo), aluminum (Al), an aluminum alloy, and the like, or a laminated film made of two or more of them.

It is to be noted that, examples of the aluminum alloy include an aluminum-neodymium alloy, for example.

The gate insulating film 13 is a single layer film made of one of $SiO_2$, $Si_3N_4$, silicon nitride oxide (SiON), hafnium oxide (HfO), aluminum oxide ($Al_2O_3$), tantalum oxide (TaO), zirconium oxide (ZrO), and the like, and oxynitrides thereof. In addition, the gate insulating film 13 may be a laminated film made of two or more of them. With such a configuration, it is possible to improve the boundary surface characteristics between the gate insulating film 13 and the oxide semiconductor layer 14, and prevent impurities contained in the substrate 11 from diffusing into the oxide semiconductor layer 14. The film thickness of the gate insulating film 13 is 200 nm to 300 nm, for example.

The oxide semiconductor layer 14 contains an oxide of one or more of, for example, indium (In), gallium (Ga), zinc (Zn), tin (Sn), and Ti as a main component. The oxide semiconductor layer 14 forms a channel between the source/drain electrodes 16A and 16B by an application of a gate voltage. The film thickness of the oxide semiconductor layer 14 is 5 nm to 200 nm, for example.

The channel protect film 15 is formed on the oxide semiconductor layer 14, and configured to prevent the channel from being damaged at the time of forming the source/drain electrodes 16A and 16B. The thickness of the channel protect film 15 is 20 to 300 nm, for example. In addition, as the material for the channel protect film 15, any materials similar to that of the gate insulating film 13 may be used.

Each of the source/drain electrodes 16A and 16B is a single layer film made of one of, for example, metals such as Mo, Al, copper (Cu), and Ti, and their alloys, and conductive materials such as ITO and TiO, or a laminated film made of two or more of them. For example, it is desirable to use a three-layer film in which three layers made of Mo, Al, and Mo, respectively, and having the film thickness of 50 nm, 500 nm, and 50 nm, respectively, are laminated in this order, or metals or metal compounds such as ITO and titanium oxide, which are metal compounds containing oxygen and form a weak bond with oxygen. With such a configuration, the electrical characteristics of the oxide semiconductor may be stably maintained.

The planarizing film 18 is made of an inorganic insulation material such as $Al_2O_3$, $TiO_2$, and nitrides thereof, for example. The thickness of the planarizing film 18 is, for example, 20 nm to 200 nm, preferably 50 nm or less. When the planarizing film 18 has the film density of 3.0 g/cm³ or more, it offers high barrier performance against oxygen and hydrogen. The lower electrode 21 of the organic EL device 20 is formed on the planarizing film 18.

Organic EL Device

The organic EL device 20 is a light emitting device of the top emission type configured to extract, from a side opposite to the substrate 11 (cathode electrode side), light which is generated when holes injected from the lower electrode 21 (anode electrode) and electrons injected from an upper electrode 24 (cathode electrode) are recombined in the light emitting layer 23C. By using the organic EL device 20 of the top emission type, the aperture ratio of a light emitting section of the display is improved. It is to be noted that, the configuration of the organic EL device 20 of the present disclosure is not limited to this, and, for example, a light emitting device of a transmission type which extracts light from the substrate 11 side, that is, the bottom emission type, may also be adopted.

In the case where the display 1 is of the top emission type, for example, in the organic EL device 20, the lower electrode 21 made of a high reflectivity material such as Al, Ti, and Cr is formed on the planarizing film 18. On the other hand, in the case where the display 1 is of the transmission type, a transparent material such as ITO, IZO, and IGZO is used.

In this instance, a partition wall 22 which ensures an insulation property between the lower electrode 21 and the upper electrode 24 described later is provided on the lower electrode 21 and on the planarizing film 18. The partition wall 22 is provided on a connection section between the gate/source electrodes 16A and 16B of the TFT 10 and the lower electrode 21. The partition wall 22 is made of, for example, an organic material such as polyimide and novolac, specifically, a photosensitive resin such as a positive-type photosensitive polyimide, and by applying a plasma treatment, hydrophobicity may be added thereto.

As illustrated in FIG. 7, for example, an organic layer 23 has a configuration in which a hole injection layer 23A, a hole transport layer 23B, a light emitting layer 23C, and an electron transport layer 23D are laminated in this order from the lower electrode 21 side. The organic layer 23 is formed by a vacuum deposition method, a spin coating method, and the like, and detailed description thereof will be given later. The top face of the organic layer 23 is covered by the upper electrode 24. While the film thickness, the configuration material, and the like of the layers configuring the organic layer 23 are not specifically limited, examples of the film thickness, the configuration material, and the like are illustrated below.

The hole injection layer 23A is a buffer layer that enhances hole injection efficiency to the light emitting layer 23C, and prevents leakage. The thickness of the hole injection layer 23A is preferably 5 nm to 200 nm, more preferably 8 nm to 230 nm, for example. The configuration material of the hole injection layer 23A may be appropriately selected based on the relationship with the material of electrodes and adjacent layers, and examples of the configuration material of the hole injection layer 23A include polyaniline, polythiophene, polypyrrol, polyphenylenevinylene, polythienylenevinylene, polyquinoline, polyquinoxaline and derivatives thereof, a conductive polymer including a polymer containing an aromatic amine structure in the main chain or the side chain, metal phthalocyanine (such as copper phthalocyanine), and carbon. Specific examples of the conductive polymer include polydioxythiophene such as oligoaniline and poly (3,4-ethylenedioxythiophene) (PEDOT).

The hole transport layer 23B enhances the hole transport efficiency to the light emitting layer 23C. Although depending on the general configuration of the device, the thickness of the hole transport layer 23B is preferably 5 nm to 200 nm, more preferably 8 nm to 230 nm, for example. As the material for configuring the hole transport layer 23B, light emitting materials which are soluble in an organic solvent, such as polyvinyl carbazole, polyfluorene, polyaniline, polysilane and derivatives thereof, a polysiloxane derivative containing an aromatic amine structure in the main chain or the side chain, polythiophene and a derivative thereof, polypyrrol, and Alq3 may be used.

When an electric field is applied to the light emitting layer 23C, recombination of electrons and holes is caused to generate light. Although depending on the general configuration of the device, the thickness of the light emitting layer 23C is preferably 10 nm to 200 nm, more preferably 20 nm to 230 nm, for example. The light emitting layer 23C may have either of a single-layer structure or a laminated structure. Specifically, it is possible to adopt not only the configuration in which light emitting layers 23CR, 23CG, and 23CB corresponding to red, green, and blue, respectively are provided as single layers on the hole transport layer 23B as is the case of the organic EL device 20 of the present embodiment, but also the configuration in which the blue light emitting layer is provided as a common layer of the organic EL devices 20R, 20G, and 20B, for example. In this case, in the red organic EL device 20R, the blue the light emitting layer 23CB is laminated on the red light emitting layer 23CR, whereas in the green organic EL device 20G, the blue the light emitting layer 23CB is laminated on the green light emitting layer 23CG. In addition, although not shown here, the red light emitting layer 23CR, the green light emitting layer 23CG, and the blue light emitting layer 23CB may be laminated, and by laminating these layers, a white organic EL device is formed.

As the material for configuring the light emitting layer 23C, any materials may be used corresponding to respective emission colors, and such materials include a polyfluorene polymeric derivative, a (poly) paraphenylenevinylene derivative, a polyphenylene derivative, a polyvinyl carbazole derivative, a polythiophene derivative, a perylene pigment, a coumalin pigment, a rhodamine pigment, and any of the above-mentioned polymers doped with an organic EL material. As the dope material, rubrene, perylene, 9,10-diphenyanthracene, tetraphenylbutadiene, nile red, coumalin 6, and the like may be used. It is to be noted that, as the material for configuring the light emitting layer 23C, two or more of the above-mentioned materials may also be used in mixture. In addition, the above-mentioned high-molecular weight materials are not limitative, and a combination of low-molecular weight materials may also be used. Examples of the low-molecular weight materials include benzine, styrylamine, triphenylamine, porphyrin, triphenylene, azatriphenylene, tetracyanoquinodimethane, triazole, imidazole, oxadiazole, polyarylalkane, phenylenediamine, arylamine, oxazole, anthracene, fluorenone, hydrazone, stilbene and derivatives thereof, monomer or oligomer of heterocyclic conjugated system such as polysilane compounds, vinyl carbazole compounds, thiophene compounds, and aniline compounds.

In addition to the above-mentioned materials, as the material for configuring the light emitting layer 23C, any of low-molecular fluorescence materials and organic light emitting materials such as phosphorescence pigments and metal complexes, which have high light emission efficiency, may be used as luminescent guest materials.

It is to be noted that, for example, the light emitting layer 23C may be a hole-transportable light emitting layer serving also as the above-described hole transport layer 23B, and in addition, may be an electron-transportable light emitting layer serving also as the electron transport layer 23D described later.

The electron transport layer 23D enhances the electron transport efficiency to the light emitting layer 23C. Although depending on the general configuration of the device, the total film thickness of the electron transport layer 23D is preferably 5 nm to 200 nm, more preferably 10 nm to 180 nm, for example.

It is preferable to use an organic material with high electron transporting capability as the material of the electron transport layer 23D. By enhancing the transportation efficiency of electrons to the light emitting layer 23C, variation in the luminescent color due to electric field strength may be suppressed. Specifically, it is preferable to use an arylpyridine derivative, a benzimidazole derivative, and the like. With such a configuration, high efficiency in supplying electrons may be maintained even with a low driving voltage. Examples of the material of the electron transport layer 23D include alkali metal, alkaline-earth metal, rare-earth metal and their oxide, composite oxide, fluoride, carbonate, and the like.

For example, the upper electrode 24 is configured to have a thickness of about 10 nm, and made of a material with favorable light transmissivity and small work function. In addition, extraction of light may be secured also by forming a transparent conductive layer with use of oxide. In such a case, ZnO, ITO, IZnO, InSnZnO, and the like may be used. Further, while the upper electrode 24 may be a single layer, the upper electrode 24 in this instance has a structure in which a first layer, a second layer, and a third layer (all not shown) are laminated in this order from the lower electrode 21 side, for example.

The material of the first layer is preferably a material with small work function and favorable light transmissivity. Specifically, examples of the material of the first layer include alkaline-earth metals such as calcium (Ca) and barium (Ba), alkali metals such as lithium (Li) and cesium (Cs), indium (In), magnesium (Mg), and silver (Ag). The examples of the material further include alkali metal oxides, alkali metal fluorides, alkaline-earth metal oxides, and alkaline-earth fluorides such as $Li_2O$, $Cs_2Co_3$, $Cs_2SO_4$, $MgF$, $LiF$, and $CaF_2$.

The second layer is made of a material having light transmissivity and favorable electrical conductivity, and for example, configured of an MgAg electrode, a Ca electrode, or the like in the form of a thin film. The third layer is preferably made of transparent lanthanoid oxide in order to suppress degradation of the electrode. With such a configuration, the third layer may be used as a sealing electrode in which light may be extracted from the top face. In addition, in the case where the organic EL device 20 is of a bottom emission type, gold (Au), platinum (Pt), AuGe, or the like is used as the material for the third layer.

It is to be noted that, the first layer, the second layer, and the third layer are formed by a vacuum deposition method, a sputtering method, a plasma CVD method, or the like. In addition, in the case where the driving system of a display employing this light emitting device is the active matrix system, it is possible that the upper electrode 24 is formed on the substrate 11 in a form of a solid film to be used as an electrode common to the pixels, in a state where the upper electrode 24 is insulated from the lower electrode 21 by the partition wall 22 and the organic layer 23 covering a part of the lower electrode 21.

In addition, the upper electrode 24 may be a mixed layer containing an organic light emitting material such as an aluminum quinoline complex, a styrylamine derivative, and a phthalocyanine derivative. In this case, the upper electrode 24 may separately include a layer made of MgAg having light transmissivity as the third layer (not shown). In addition, the upper electrode 24 is not limited to the above-mentioned laminate structure and, naturally, according to the structure of a device to be formed, any suitable combination and laminate structure may be adopted. For example, the above-mentioned configuration of the upper electrode 24 of the present embodiment is a laminate structure in which the functions of the electrode layers are separated from each other, that is, an inorganic layer (the first layer) for facilitating electron injection into the organic layer 23, an inorganic layer (the second layer) ruling the electrode, and an inorganic layer (the third layer) for protecting the electrode are separated from each other. However, the inorganic layer for facilitating electron injection into the organic layer 23 may used also as the inorganic layer ruling the electrode, and these layers may be configured in a single layer structure.

Further, in the case where the organic EL device 20 has a cavity structure, the upper electrode 24 is preferably made of a semi-transmissive and semi-reflective material. With such a configuration, light which has been subjected to multiple interference between a light-reflecting surface on the lower electrode 21 side and a light-reflecting surface on the upper electrode 24 side is extracted from the upper electrode 24 side. In this case, it is assumed that the optical distance between the light-reflecting surface on the lower electrode 21 side and the light-reflecting surface on the upper electrode 24 side is defined according to the wavelength of light to be extracted, and that the film thicknesses of the layers are set so as to satisfy the optical distance. By actively using this cavity structure in such a light emitting device of the top emission type, improvement of light extraction efficiency to outside and control of light emission spectrum become possible.

The protect film 25 is configured to prevent water from infiltrating into the organic layer 23, and made of a material with low transmissivity and low water permeability, with a thickness of, for example, 2 to 3 μm. The protect film 25 may be made of any of insulating materials and conductive materials. As the insulating materials, it is preferable to use an inorganic-amorphous insulating material such as amorphous silicon (α-Si), amorphous carbide silicon (α-SiC), amorphous silicon nitride (α-$Si_{1-x}N_x$), and amorphous carbon (α-C). Since such inorganic-amorphous insulating materials produce no grain, a favorable protect film with low water permeability may be obtained.

A sealing substrate 27 is provided on the upper electrode 24 side of the organic EL device 20 to seal the organic EL device 20 in conjunction with a bonding layer 26. The sealing substrate 27 is made of a transparent material such as glass for light generated at the organic EL device 20. The sealing substrate 27 is provided with, for example, a color filter 27A and a black matrix 27B. The sealing substrate 27 extracts the light generated at the organic EL device 20 and absorbs external light reflected by wirings between the organic EL devices 20 to improve contrast.

The color filter 27A and the black matrix 27B are provided on the sealing substrate 27, for example. The color filter 27A includes a red filter 27AR, a green filter 27AG, and a blue filter 27AB, and is disposed on corresponding organic EL devices 20R, 20G, and 20B, respectively. For example, each of the red filter 27AR, the green filter 27AG, and the blue filter 27AB has a rectangular form, and they are formed with no gap therebetween. Each of the red filter 27AR, the green filter 27AG, and the blue filter 27AB is made of a resin mixed with a pigment, and by selecting the pigment, it is possible to adjust the light transmittance rate thereof such that the light transmittance rate of desired wavelength range of red, green, or blue is set high, and the light transmittance rate of wavelength range of the rest is set low.

The black matrix 27B is configured of, for example, a black resin film mixed with a black colorant and having an optical density of 1 or more, or a thin film filter utilizing interference of a thin film. If the black resin film is adopted, the black matrix 27B may be formed cheaply and easily, which is preferable. The thin film filter is a filter in which, for example, one or more thin films each made of metal, metal nitride, or metal oxide is laminated to attenuate light by utilizing interference of the thin film. A specific example of the thin film filter includes a thin film filter in which Cr and chromium oxide (III) ($Cr_2O_3$) are alternately laminated.

In addition, the organic layer 23 may be formed by, in addition to the above-mentioned method, an application method such as the spin coating method, a dipping method, a doctor blade method, a discharge coating method, and a spray coating method, a printing method such as an ink jet method, an offset printing method, a relief printing method, an intaglio printing method, a screen printing method, a micro-gravure coating method, or the like. Depending on the property of organic layers and other members, dry process and wet process may be concurrently used.

1-3. Manufacturing Method

For example, the display 1 may be manufactured in the following manner.

Figure 8:
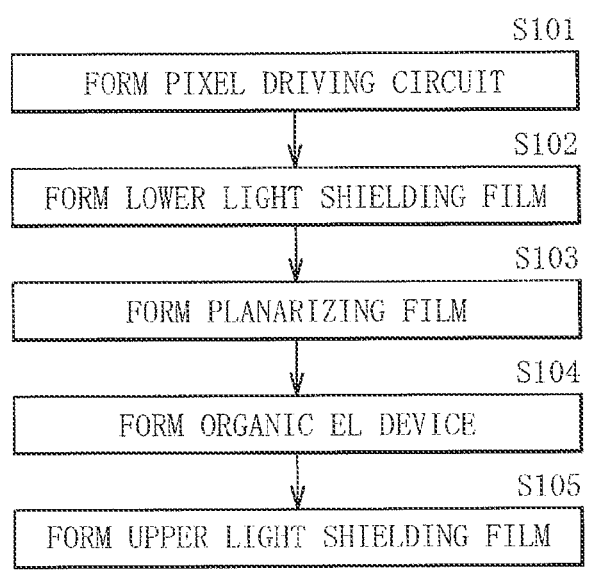
FIG. 8 is a chart showing a flow of a method of manufacturing the display illustrated in FIG. 1.

FIG. 8 shows a flow of a method of manufacturing the display 1. FIG. 9A to FIG. 11C show the method of manufacturing the display 1 in the order of the processes. First, as illustrated in FIG. 9A, in the pixel region 2, the pixel driving circuit 140 including the TFT 10 is formed on the substrate 11 made of the above-described material, whereas in the frame region 3 (see FIG. 1), an extraction electrode 31 (see FIG. 1) is formed (step S101).

Next, the lower light shielding film 5A is formed on the frame region 3 side of the TFT 10, in other words, between the pixel region 2 and the terminal section 4 (step S102). First, as illustrated in FIG. 9A, for example, a $SiO_2$ film 17 having a thickness of 500 nm is formed on the substrate 11 on the frame region 2 side of the TFT 10 with use of an area mask 41, by the sputtering method or the CVD (chemical vapor deposition) method, for example. Then, as illustrated in FIG. 9B, a photoresist film 42 is applied on the TFT 10 and the $SiO_2$ film 17 by, for example, the spin coating method, and thereafter, as illustrated in FIG. 9C, exposure is carried out with use of a photomask 43 and development is carried out with use of, for example, a paddle-type developing apparatus. Next, as illustrated in FIG. 9D, after the photoresist film 42 is processed, the exposed $SiO_2$ film is removed by, for example, wet etching or dry etching. Then, by removing the remaining the photoresist film 42, columnar recessed portions 17A (FIG. 10A) each having a size of $\phi$=1000 nm, for example, are formed. Next, as illustrated in FIG. 10B, with use of an area mask 44, for example, a $TiO_2$ film is formed between the pixel region 2 and the terminal section 4 (the frame region 3) by, for example, the sputtering method or the CVD method, thereby forming irregularities on a bottom face of the lower light shielding film 5A and the top face in contact with the planarizing film 18.

Process for Forming Planarizing Film 18

Next, as illustrated in FIG. 10(C), after the planarizing film 18 is formed on the TFT 10 and a part of the lower light shielding film 5A, the organic EL device 20 and the upper light shielding film 5B are formed (steps S103 to S105). First, as an insulation material having positive-type photosensitivity, for example, polyimide is applied on the TFT 10 and a part of the lower light shielding film 5A by, for example, the spin coating method, and exposure is carried out with use of an exposure apparatus. Then, development is carried out with use of, for example, the paddle-type developing apparatus to form a polyimide film having a predetermined form, and thereafter the polyimide film is heat-cured in, for example, a clean baking furnace to form the planarizing film 18 having a thickness of 2 μm and including a contact hole 18A.

(Process for Forming Lower Electrode 21)

Subsequently, for example, a conductive film made of, for example, an Al alloy is patterned on the planarizing film 18, thereby the lower electrode 21 is formed for each of the red organic EL device 20R, the green organic EL device 20G, and the blue organic EL device 20B. At this time, the lower electrode 21 is electrically connected to the drain electrode 16B of the transistor 10 through the contact hole 18A of the planarizing film 18. Specifically, for example, a film made of an Al alloy is formed on the planarizing film 18 to have a film thickness of, for example, 200 nm, and then patterned by the photolithography method to form the lower electrode 21.

Process for Forming Partition Wall 22

Next, the partition wall 22 is formed on the lower electrode 21 and the planarizing film 18. Specifically, for example, polyimide is applied on the lower electrode 21 and the planarizing film 18 by the spin coating method, and thereafter the polyimide is subjected to exposure and development and is then patterned to obtain a predetermined form, thereby forming the partition wall 22.

Process for Forming Organic Layer 23 and Upper Electrode 24

Next, the hole injection layer 23A, the hole transport layer 23B, the light emitting layer 23C, the electron transport layer 23D, and the upper electrode 24 which are made of the above-described materials are sequentially formed on the lower electrode 21. Specifically, for example, after the substrate 11 is baked under $N_2$ atmosphere and processed by $O_2$ plasma, the organic layer 23 (the hole injection layer 23A, the hole transport layer 23B, the light emitting layer 23C, and the electron transport layer 23D) and the upper electrode 24 are sequentially formed by, for example, a vacuum deposition method. It is to be noted that, as the method for forming the organic layer 23 and the upper electrode 24, for example, not only the vacuum deposition method, but also the spin coating method, the spray coating method, and slit printing may be adopted.

After the upper electrode 24 is formed, the protect film 25 is formed. Specifically, first, the protect film 25 is formed to the extent that it does not affect the foundation by a film formation method such as a deposition method and the CVD method in which the energy of film-forming particles is small. For example, in the case where the protect film 25 made of $SiO_2$ is to be formed, the film is formed to have a film thickness of, for example, 5 μm by the CVD method. At this time, in order to prevent luminance from decreasing due to degradation of the organic layer 23, the film formation temperature is desirably set to room temperature, and in order to prevent peel-off of the protect film 25, the film is desirably formed in a condition that the stress of the film is at a minimum level.

It is to be noted that, in the case where an auxiliary electrode (not shown) is formed in the same process as the lower electrode 21, the organic layer 23 formed on the auxiliary electrode as a solid film may be removed by a method such as a laser ablation before the upper electrode 24 is formed. With such a configuration, the upper electrode 24 may be directly connected to the auxiliary electrode, while improving the connection thereof.

Process for Forming Upper Light Shielding Film 5B

Figure 11A:
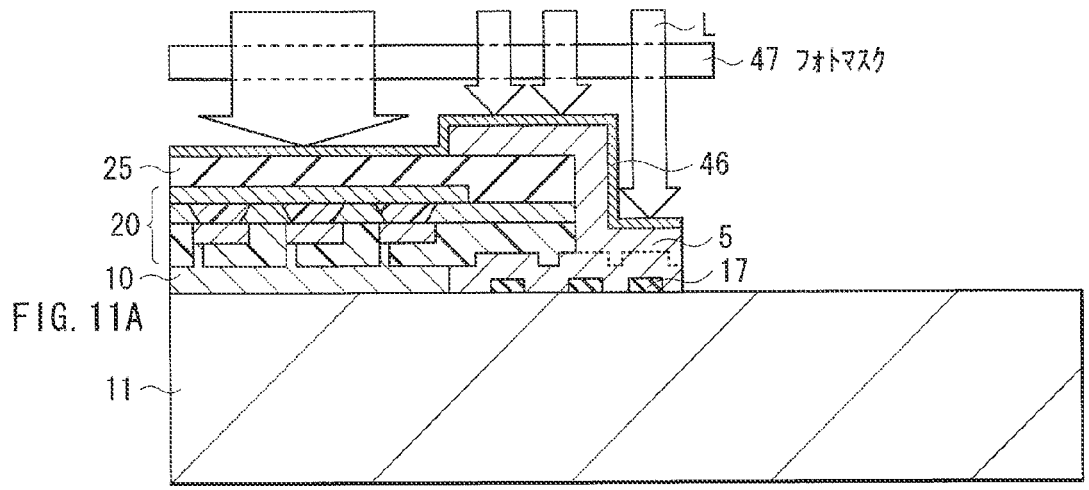
FIGS. 11A to 11C are sectional views showing processes subsequent to the process of FIG. 10D.
Figure 11B:
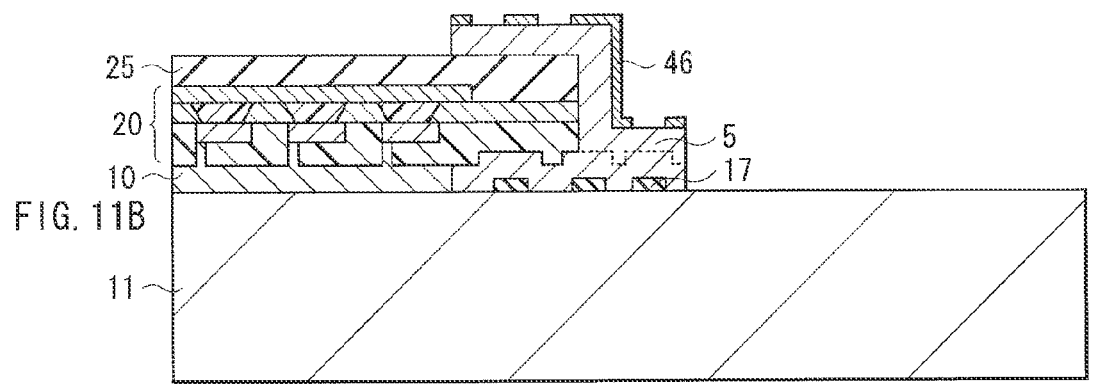
Figure 11C:
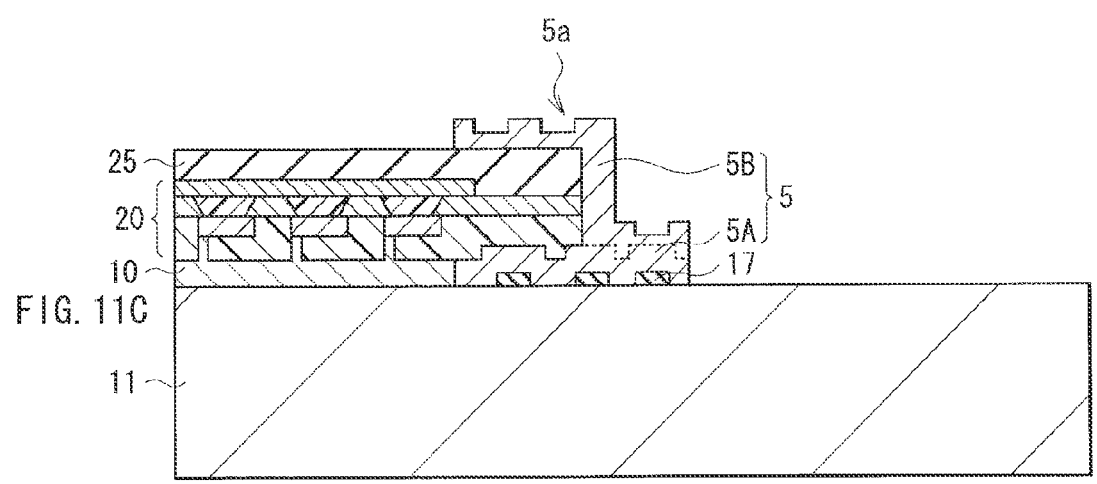

After the protect film 25 is formed, the upper light shielding film 5B is formed on the side face and a part of the top face of the organic EL device 20. Specifically, with use of an area mask 45, a $TiO_2$ film having a thickness of, for example, 1,500 nm is formed in the frame region 3 by, for example, the sputtering or the CVD method. Then, as illustrated in FIG. 10D, a photoresist film 46 is applied on the protect film 25 and the $TiO_2$ film by the spin coating method. Next, as illustrated in FIG. 11A, exposure and development are carried out with use of a photomask 47, and the photoresist film 46 is processed as illustrated in FIG. 11B. Next, as illustrated in FIG. 11C, the recessed portions 5a are formed in the exposed $TiO_2$ film by wet etching or dry etching, and thereafter the remaining photoresist film 46 is removed to form the upper light shielding film 5B. In this way, the light shielding film 5 which covers a region ranging from the side face of the TFT 10 to a part of the top face of the organic EL device 20 is completed.

After the upper light shielding film 5B is formed, for example, the black matrix 27B made of the above-described material is formed on the sealing substrate 27 made of the above-described material. Next, the material of the red filter 27AR is applied on the sealing substrate 27 by the spin coating method or the like. Then, the material is patterned by the photolithographic technique and baked to form the red filter 27AR. Next, as is the case of the red filter 27AR, the green filter 27AG is sequentially formed. Thereafter, the bonding layer 26 is formed on the protect film 25, the light shielding film 5, and the substrate 11, and the sealing substrate 27 is bonded thereto through the bonding layer 26.

Next, for example, an anisotropic conductive film 32 formed on the film is disposed and temporarily fixed on a COF (Chip On Film) 33 including a driver IC 34 and the like, and then alignment of the COF 33 and the extraction electrode 31 formed in the terminal section 4 on the substrate 11 are carried out. In this state, with the anisotropic conductive film 32 therebetween, the extraction electrode 31 and the COF 33 are heated while being pressed, and the extraction electrode 31 and a wiring of the COF 33 are electrically connected by conductive fine particles contained in the anisotropic conductive film 32, and the COF 33 is formed in the terminal section 4 of the substrate 11. Then, an ultraviolet curable resin is applied in such a manner as to seal the bonding layer 26 sealing the TFT 10, the organic EL device 20, a side face of the sealing substrate 27 provided on the bonding layer 26, a part of the COF 33, and the like. Further, an ultraviolet curable resin is applied on a rear face side of the substrate 11 in such a manner as to seal an end face of the extraction electrode 31 and an end face of the anisotropic conductive film 32. Thereafter, UV light (wavelength 365 nm) of 1000 mJ/cm$^2$ is applied to cure the ultraviolet curable resin, and thus the damp-proof reinforcing materials 35A and 35B are formed. In this way, the display 1 illustrated in FIG. 1 and FIG. 3A to FIG. 5 is completed.

In the display 1, a scanning signal is supplied from the scan line driving circuit 130 to each pixel through the gate electrode of the writing transistor Tr2, and an image signal supplied from the signal line driving circuit 120 through the writing transistor Tr2 is held in the capacitor Cs. Specifically, the driving transistor Tr1 is turned on or off according to the signal held in the capacitor Cs, and with this, a driving current Id is injected into the red organic EL device 20R, the green organic EL device 20G, and the blue organic EL device 20B, whereby holes and electrons are recombined to generate light. In the case of the bottom emission, the generated light is extracted after passing through the lower electrode 21 and the substrate 11, whereas in the case of the top emission, the light is extracted after passing through the upper electrode 24 and the color filter 27A provided on the sealing substrate 27.

As mentioned before, narrower frame is desired in displays such as mobile displays. For this reason, the distance between a terminal section provided in a frame region and pixels provided in a pixel region is significantly shortened. In the mounting process of a TFT, a light emitting device, and the like, a damp-proof reinforcing material is provided to a terminal section in order to prevent peel-off of a COF after pressure bonding of the COF and prevent corrosion of the terminal section due to infiltration of water. Since this damp-proof reinforcing material is made of an ultraviolet curable resin as described above, UV light is applied to the material in the manufacturing process. There is an issue that, at the time of such a UV light irradiation, in a display with a narrowed frame, UV light applied to cure the material passes through the damp-proof reinforcing material, and then enters a semiconductor layer of a TFT disposed in a peripheral portion of a pixel region, leading to deterioration of the TFT characteristics.

Figure 12:
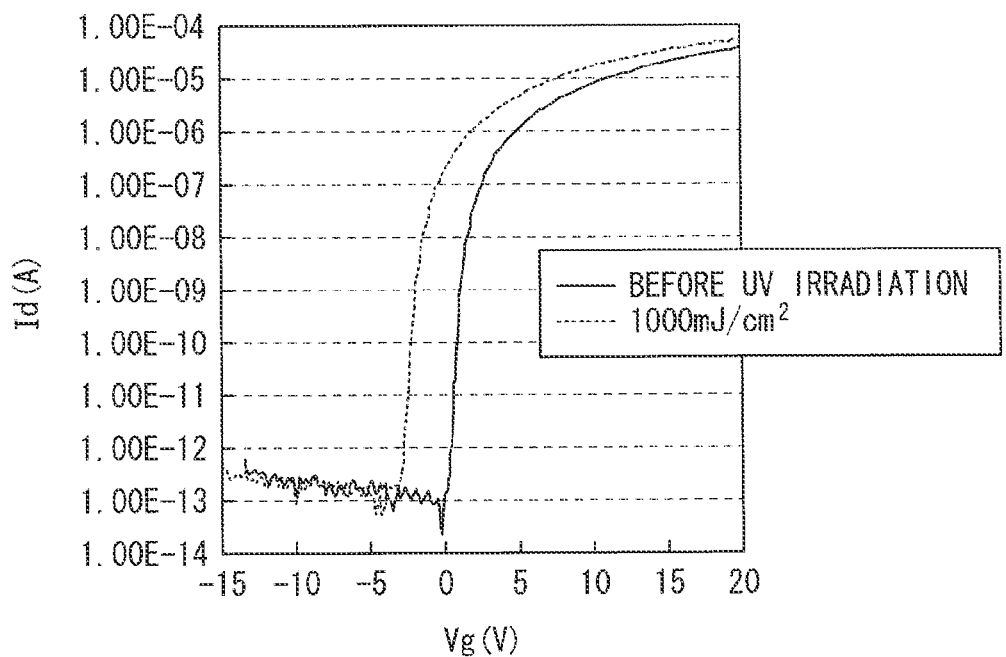
FIG. 12 is a characteristic diagram of a TFT according to a comparative example.
Figure 13:
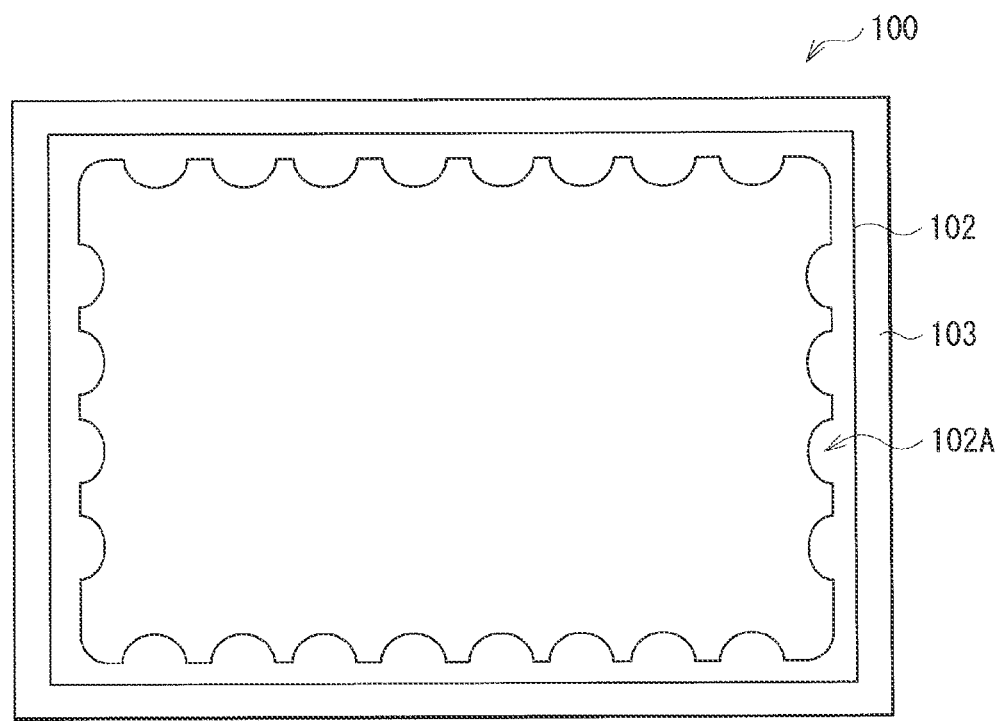
FIG. 13 is a schematic view of a display according to the comparative example.

FIG. 12 shows the current and voltage characteristics of a TFT disposed in a peripheral portion of a pixel region 102 of a known display 100 before and after UV irradiation. As shown in FIG. 12, the threshold level voltage (Vth) after the irradiation is shifted to the negative (−) direction than before the UV irradiation. With this, there is an issue that the TFT characteristics of the peripheral portion of the pixel region 102 in the display 100 are deteriorated to form a luminance-dropping region 102A in which the luminance of the peripheral portion of the pixel region 102 is reduced as illustrated in FIG. 13, causing uneven luminance.

Figure 14:
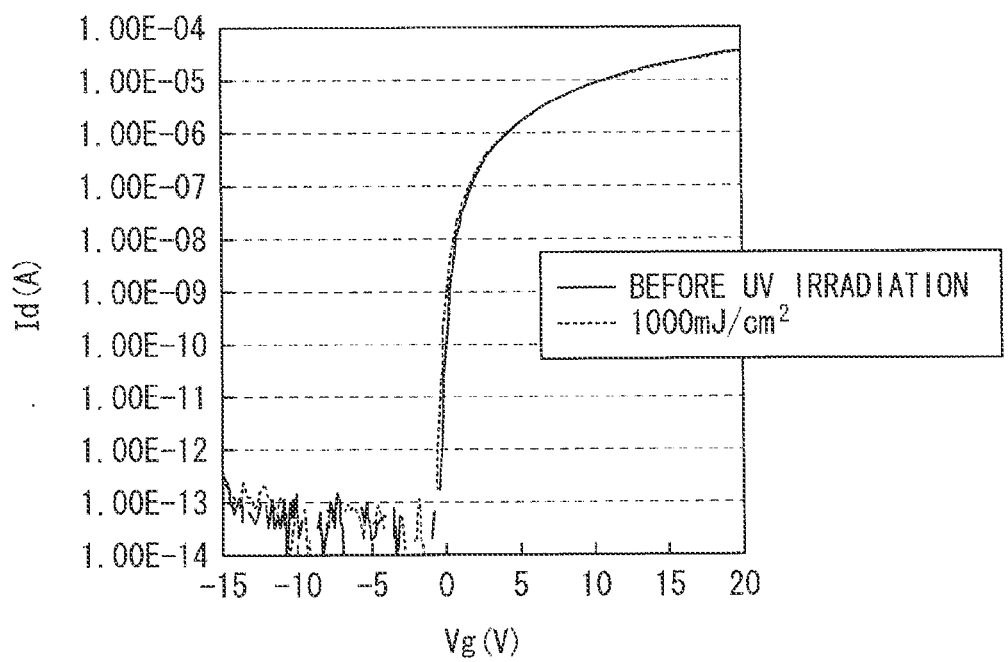
FIG. 14 is a characteristic diagram of a TFT of the display according to the embodiment of the present disclosure.

In contrast, the display 1 of the present embodiment is provided with the light shielding film 5 made of TiO$_2$ (FIG. 3B) or the like which covers the side face of the TFT 10, the side face of the organic EL device 20, and a part of the top face of the organic EL device 20. FIG. 14 shows the current and voltage characteristics of the TFT 10 disposed in the peripheral portion of the pixel region 2 of the display 1 of the present embodiment before and after UV irradiation. As shown in FIG. 14, the threshold level voltage (Vth) is not shifted between before and after the UV irradiation. In this way, it is possible to suppress incidence of UV light which is obliquely applied to the TFT 10 at the time of formation of the damp-proof reinforcing materials 35A and 35B or the like on the TFT 10, and it is thus possible to suppress deterioration of TFT characteristics.

As described above, in the display 1 and the method of manufacturing the same of the present embodiment, after the TFT 10 and the organic EL device 20 are formed, the light shielding film 5 covering the end face of the TFT 10 and the like is formed, and therefore, UV light incident on the TFT 10 from an oblique direction, especially from the frame region 3 side, may be effectively shielded. In this way, deterioration of TFT characteristics is suppressed, and thus generation of unevenness of luminance in the pixel region 2 is reduced. In other words, it is possible to provide a high-quality display which causes less unevenness of luminance.

In addition, since, in the present embodiment, the recessed portions 5a are provided on the surface of the light shielding film 5, it is possible to effectively shield UV light coming from an oblique direction. Further, since UV light is reflected by the irregularities of the light shielding film 5 to the frame region 3 side, that is, the damp-proof reinforcing materials 35A and 35B side, it is possible to cure the ultraviolet curable resin configuring the damp-proof reinforcing materials 35A and 35B with a reduced amount of irradiation of UV light.

2. APPLICATION EXAMPLE

For example, the above-mentioned display 1 may be installed in electronic units illustrated in the following application examples 1 to 5.

Module and Application Examples

Hereinafter, application examples of the display 1 described in the above-mentioned embodiment will be described. The display 1 of the above-mentioned embodiment may be applied to displays of electronic units in various fields which display an externally inputted video signal or an internally generated video signal as an image or a video. Typical examples of such an electronic unit include televisions, digital cameras, notebook personal computers, mobile terminal units such as mobile phones, and video camcorders.

Module

Figure 15:
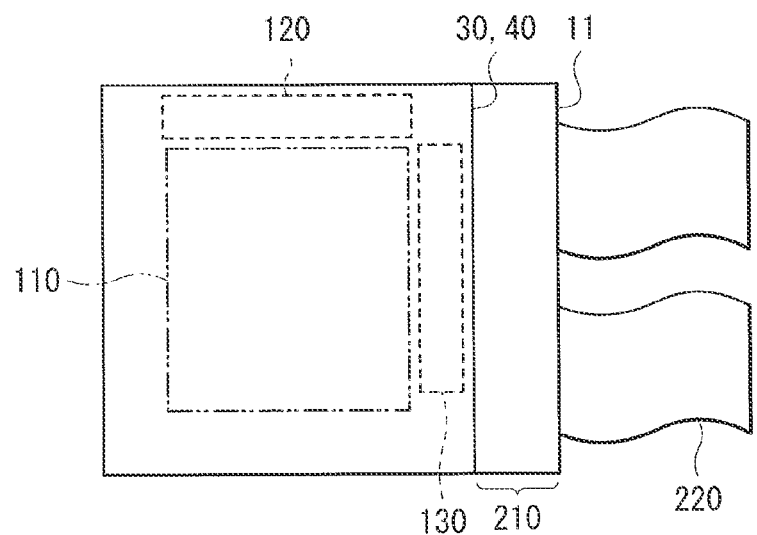
FIG. 15 is a plan view showing a schematic configuration of a module including the display of the embodiment.

The display 1 of the above described embodiment and so forth is incorporated in various kinds of electronic units of application examples 1 to 5 described below and the like, as a module shown in FIG. 15, for example. This module includes, for example, a region 210 which is provided on one side of a substrate 11 and exposed from a protect film and a sealing substrate 30. Wirings of the signal line driving circuit 120 and the scan line driving circuit 130 are extended to configure an external connection terminal (not shown) in the exposed region 210. The external connection terminal may be provided with a flexible printed circuit (FPC) 220 for inputting and outputting signals.

Application Example 1

Figure 16:
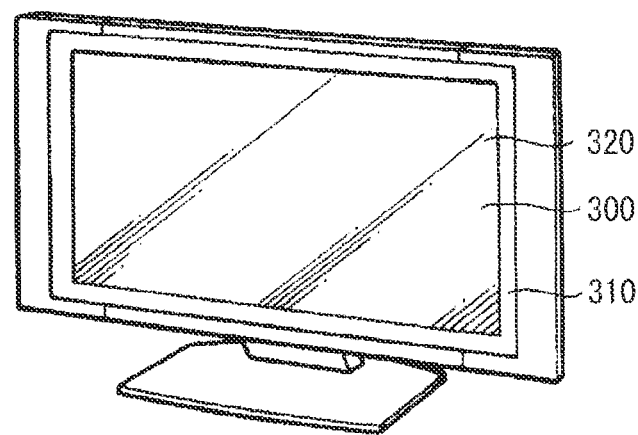
FIG. 16 is a perspective view showing an external appearance of application example 1.

FIG. 16 shows an external appearance of a television to which the display 1 of the above-mentioned embodiment is applied. The television is provided with, for example, an image-display screen section 300 including a front panel 310 and a filter glass 320, and the image display screen section 300 is configured of the display 1 according to the above-mentioned embodiment.

Application Example 2

Figure 17A:
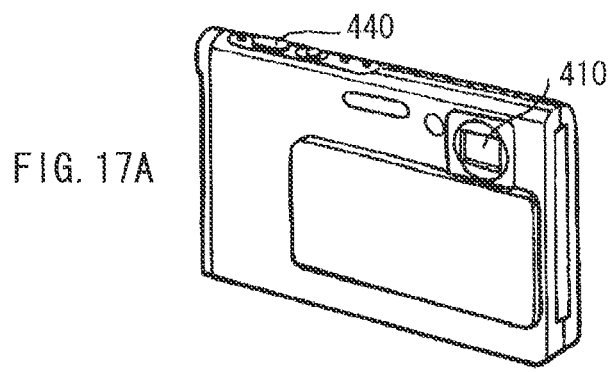
FIG. 17A is a perspective view showing an external appearance of application example 2 as viewed from a front side.
Figure 17B:
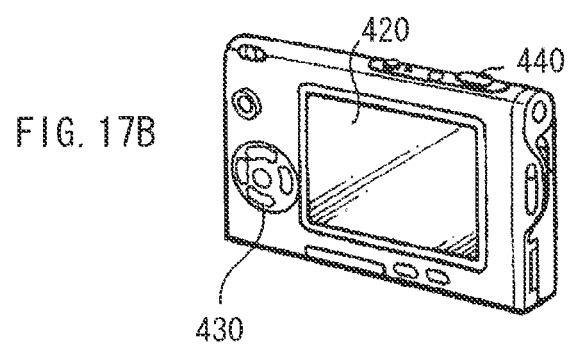
FIG. 17B is a perspective view showing an external appearance of the application example 2 as viewed from a rear side.

FIGS. 17A and 17B show external appearances of a digital camera to which the display 1 of the above-mentioned embodiment is applied. This digital camera includes, for example, a light emitting section 410 for generating flash light, a display section 420, a menu switch 430, and a shutter button 440, and the display section 420 is configured of the display 1 according to the above-mentioned embodiment.

Application Example 3

Figure 18:
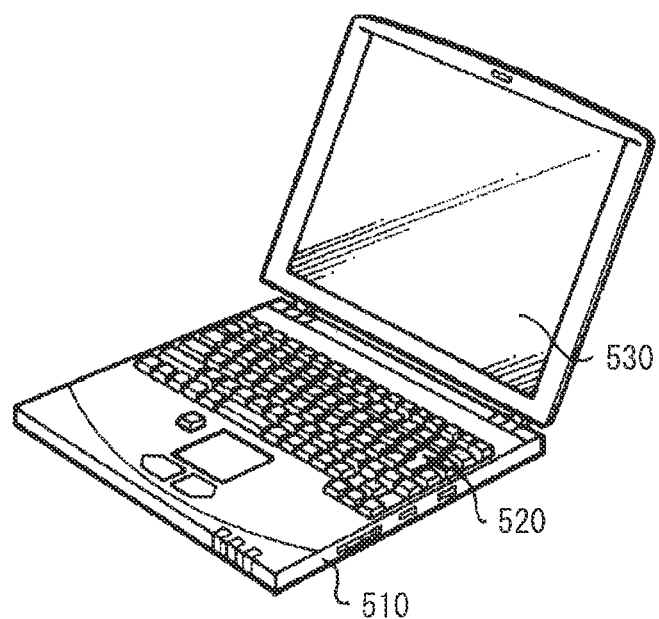
FIG. 18 is a perspective view showing an external appearance of application example 3.

FIG. 18 shows an external appearance of a notebook personal computer to which the display 1 of the above-mentioned embodiment is applied. This notebook personal computer includes, for example, a main body 510, a keyboard 520 for inputting letters and the like, and a display section 530 for displaying an image, and the display section 530 is configured of the display 1 according to the above-mentioned embodiment.

Application Example 4

Figure 19:
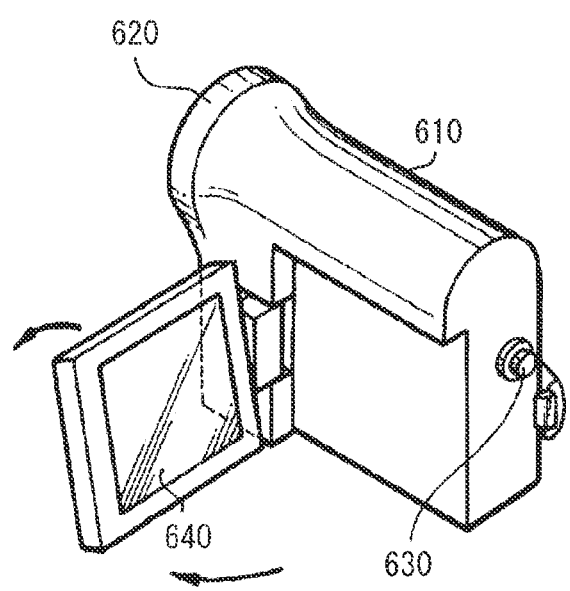
FIG. 19 is a perspective view showing an external appearance of application example 4.

FIG. 19 shows an external appearance of a video camcorder to which the display 1 of the above-mentioned embodiment is applied. This video camcorder includes, for example, a main body section 610, a lens 620 which is adapted to take an image of a subject and provided on the front side of the main body section 610, a start/stop switch 630 for capturing an image, and a display section 640, and the display section 640 is configured of the display 1 according to the above-mentioned embodiment.

Application Example 5

FIGS. 20A to 20G each show an external appearance of a mobile phone to which the display 1 of the above-mentioned embodiment is applied. This mobile phone includes, for example, an upper housing 710, a lower housing 720, a connecting section (hinge section) 730 connecting the upper housing 710 and the lower housing 720, a display 740, a sub-display 750, a picture light 760, and a camera 770. The display 740 or the sub-display 750 is configured of the display 1 according to the above-mentioned embodiment.

Hereinabove, while the present disclosure has been described with reference to the embodiment, the present disclosure is not limited to the above-mentioned embodiment, and various modifications may be made. For example, in the above-mentioned embodiment, the red light emitting layer, the green light emitting layer, and the blue light emitting layer corresponding to respective pixels are provided as the light emitting layer 23C, but this is not limitative, and the light emitting layers may be laminated to configure a white organic EL device. In such a case, the red light emitting layer and the green light emitting layer may be replaced by a yellow light emitting layer.

In addition, the material and thickness of each layer, the method and condition for film formation, and the like described in the above-mentioned embodiment are not limitative, and other materials and thicknesses, other methods and conditions for film formation may be adopted. For example, while an oxide semiconductor is used as the channel of the TFT 10 in the above-mentioned embodiment, this is not limitative, and silicon or an organic semiconductor may also be used.

Further, while the configuration of the organic EL devices 20R, 20G, and 20B, and the like is specifically described in the above-mentioned embodiment, all of the layers need not necessarily be included, and other layers may be further included. For example, it is possible to form the light emitting layer 23C directly on the hole injection layer 23A without forming the hole transport layer 23B, and it is also possible to provide an electron injection layer on the electron transport layer 23D.

Still further, while the active-matrix type display is described in the above-mentioned embodiment, the present disclosure may also be applied to a passive matrix type display. Still further, the configuration of the pixel driving circuit for active matrix drive is not limited to the configuration described in the above-mentioned embodiment, and a capacitive element and a transistor may be added as necessary. In such a case, according to the change of the pixel driving circuit, a necessary driving circuit may be added, in addition to the above-described signal line driving circuit 120 and the scan line driving circuit 130.

It is to be noted that the present technology may be configured as follows.

In an embodiment, a display includes a resin, a transistor, and a light shielding material positioned between the resin and the transistor, wherein the light shielding material is configured to suppress an incidence of light on the transistor.

In the display according to an embodiment, the transistor is a thin film transistor.

In the display according to an embodiment, the transistor includes an oxide semiconductor.

In the display according to an embodiment, the display further includes a light emitting device. The light emitting device and the transistor are in a pixel region, and the light shielding material is at a periphery of the pixel region.

In the display according to an embodiment, the light shielding material covers a side of the transistor facing a periphery of the display and covers a side of the light emitting device facing the periphery of the display.

In the display according to an embodiment, the display further includes a light emitting device, wherein the light shielding material covers an upper side of the light emitting device.

In the display according to an embodiment, the display further includes a light emitting device, and an insulating layer between the light emitting device and the transistor. The light shielding material is provided on a side of the insulating layer.

In the display according to an embodiment, the display further includes a light emitting device, and a protective layer provided above the light emitting device. The light shielding material is provided on at least one of an upper side and a peripheral side of the protective layer.

In the display according to an embodiment, the light shielding material includes a plurality of recessed portions.

In the display according to an embodiment, irregularities are provided on a surface of the light shielding material.

In the display according to an embodiment, the light shielding material is at least one of titanium oxide, zinc oxide, a metal and silicide thereof, and a material with a barrier metal, wherein the metal and barrier metal can include any suitable material or combination of materials, such as Al, Cu, W, Au, Ag, Ta, Co, and Ti for the metal; and such as Ti, Ta, TiN, and TaN for the barrier metal.

In the display according to an embodiment, the display further includes a light emitting device, and a contact layer in contact with the light emitting device and the transistor. The light shielding material is at a position equal to or higher than where the contact layer contacts the transistor.

In the display according to an embodiment, the light shielding material is provided at a position lower than a height of the transistor.

In the display according to an embodiment, the display further includes a Chip On Film, wherein the light shielding material is provided between the Chip on Film and the transistor.

In the display according to an embodiment, the display further includes an insulting layer and a light emitting device. The light shielding material is provided on a side of the insulating layer and around the light emitting device.

In the display according to an embodiment, the display further includes a light emitting device, wherein the shielding material is provided at a height of the light emitting device.

In an embodiment, a method of manufacturing a display includes forming a resin, a transistor, and a light shielding material. The light shielding material is positioned between the resin and the transistor, and the light shielding material is configured to suppress an incidence of light on the thin film transistor.

In the method according to an embodiment, the transistor is a thin film transistor.

In the method according to an embodiment, the transistor includes an oxide semiconductor.

In the method according to an embodiment, the method further including forming a light emitting device. The light emitting device and the transistor are formed in a pixel region, and the light shielding material is formed at a periphery of the pixel region.

In the method according to an embodiment, the light shielding material is positioned to cover a side of the transistor facing a periphery of the display and to cover a side of the light emitting device facing the periphery of the display.

In the method according to an embodiment, the method further includes forming a light emitting device, wherein the light shielding material is positioned to cover an upper side of the light emitting device.

In the method according to an embodiment, the method further includes forming an insulating layer and a light emitting device. The insulating layer is positioned between the light emitting device and the transistor, and the light shielding material is positioned on a side of the insulating layer.

In the method according to an embodiment, the method further includes forming a protective layer and a light emitting device. The protective layer is positioned above the light emitting device, and the light shielding material is positioned on at least one of an upper side and a peripheral side of the protective layer.

In the method according to an embodiment, the method further includes forming a plurality of recessed portions in the light shielding material.

In the method according to an embodiment, irregularities are provided on a surface of the light shielding material.

In the method according to an embodiment, the light shielding material is at least one of titanium oxide, zinc oxide, a metal and silicide thereof, and a material with a barrier metal, wherein the metal and barrier metal can include any suitable material or combination of materials, such as Al, Cu, W, Au, Ag, Ta, Co, and Ti for the metal; and such as Ti, Ta, TiN, and TaN for the barrier metal.

In the method according to an embodiment, the method further includes forming a light emitting device and forming a contact layer in contact with the light emitting device and the transistor. The light shielding material is at a position equal to or higher than where the contact layer contacts the transistor.

In the method according to an embodiment, the light shielding material is provided at a position lower than a height of the transistor.

In the method according to an embodiment, the method further includes forming a Chip On Film, wherein the light shielding material is positioned between the Chip on Film and the transistor.

In the method according to an embodiment, the method further includes forming an insulting layer and a light emitting device, wherein the light shielding material is provided on a side of the insulating layer and around the light emitting device.

In the method according to an embodiment, the method further includes forming a light emitting device, wherein the shielding material is provided at a height of the light emitting device.

In an embodiment, an electronic apparatus includes a resin, a transistor, and a light shielding material positioned between the resin and the thin film transistor. The light shielding material is configured to suppress an incidence of light on the transistor.

In the electronic apparatus according to an embodiment, the electronic apparatus further includes a display.

In the electronic apparatus according to an embodiment, the display is an OLED, electric paper, or a liquid crystal display.

In the electronic apparatus according to an embodiment, the transistor is a thin film transistor.

In the electronic apparatus according to an embodiment, the transistor includes an oxide semiconductor.

In the electronic apparatus according to an embodiment, the electronic apparatus further includes a light emitting device. The light emitting device and the transistor are in a pixel region, and the light shielding material is at a periphery of the pixel region.

In the electronic apparatus according to an embodiment, the light shielding material covers a side of the transistor facing a periphery of a display and covers a side of the light emitting device facing the periphery of the display.

In the electronic apparatus according to an embodiment, the electronic apparatus further includes a light emitting device, wherein the light shielding material covers an upper side of the light emitting device.

In the electronic apparatus according to an embodiment, the electronic apparatus further includes a light emitting device, and an insulating layer between the light emitting device and the transistor. The light shielding material is provided on a side of the insulating layer.

In the electronic apparatus according to an embodiment, the electronic apparatus further includes a light emitting device and a protective layer provided above the light emitting device. The light shielding material is provided on at least one of an upper side and a peripheral side of the protective layer.

In the electronic apparatus according to an embodiment, the light shielding material includes a plurality of recessed portions.

In the electronic apparatus according to an embodiment, irregularities are provided on a surface of the light shielding material.

In the electronic apparatus according to an embodiment, the light shielding material is at least one of titanium oxide, zinc oxide, a metal and silicide thereof, and a material with a barrier metal, wherein the metal and barrier metal can include any suitable material or combination of materials, such as Al, Cu, W, Au, Ag, Ta, Co, and Ti for the metal; and such as Ti, Ta, TiN, and TaN for the barrier metal.

In the electronic apparatus according to an embodiment, the electronic apparatus further includes a light emitting device and a contact layer in contact with the light emitting device and the transistor. The light shielding material is at a position equal to or higher than where the contact layer contacts the transistor.

In the electronic apparatus according to an embodiment, the light shielding material is provided at a position lower than a height of the transistor.

In the electronic apparatus according to an embodiment, the electronic apparatus further includes a Chip On Film. The light shielding material is provided between the Chip on Film and the transistor.

In the electronic apparatus according to an embodiment, the electronic apparatus further includes an insulting layer and a light emitting device. The light shielding material is provided on a side of the insulating layer and around the light emitting device.

In the electronic apparatus according to an embodiment, the electronic apparatus further includes a light emitting device, wherein the shielding material is provided at a height of the light emitting device.

The present disclosure contains subject matter related to that disclosed in Japanese Priority Patent Application JP 2011-180778 filed in the Japan Patent Office on Aug. 22, 2011, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

The application is claimed as follows:

1. A display comprising:
   a transistor positioned in a pixel region;
   a light shielding material positioned outside the pixel region, at least a portion of the light shielding material being positioned laterally with respect to the transistor to cover at least a part of a side face of the transistor thereby suppressing an incidence of light on the transistor; and
   a resin positioned outside the pixel region and the light shielding material such that the light shielding material is positioned between the transistor and the resin,
   wherein the light shielding material includes a plurality of recessed portions on an outer light incidence side of the light shielding material.

2. The display of claim 1, wherein the transistor is a thin film transistor.

3. The display of claim 1, wherein the transistor includes an oxide semiconductor.

4. The display of claim 1, further comprising:
   a light emitting device, wherein the light emitting device and the transistor are in the pixel region.

5. The display of claim 4, wherein the light shielding material covers a side of the transistor facing a periphery of the display and covers a side of the light emitting device facing the periphery of the display.

6. The display of claim 1,
   further comprising a light emitting device,
   wherein the light shielding material contacts an upper side of the light emitting device.

7. The display of claim 1, further comprising:
   a light emitting device; and
   an insulating layer between the light emitting device and the transistor,
   wherein the light shielding material is provided on a side of the insulating layer.

8. The display of claim 1, further comprising:
   a light emitting device; and
   a protective layer provided above the light emitting device,
   wherein the light shielding material is provided on at least one of an upper side and a peripheral side of the protective layer.

9. The display of claim 1, wherein irregularities are provided on a surface of the light shielding material.

10. The display of claim 1, wherein the light shielding material is at least one of titanium oxide and zinc oxide.

11. The display of claim 1, further comprising:
    a light emitting device; and
    contact layer in contact with the light emitting device and the transistor,
    wherein the light shielding material is at a position equal to or higher than where the contact layer contacts the transistor.

12. The display of claim 1, wherein a bottom side of the light shielding material is coplanar with a bottom side of the transistor.

13. The display of claim 1, further comprising:
    a Chip On Film,
    wherein the light shielding material is provided between the Chip on Film and the transistor.

14. The display of claim 1, further comprising:
    an insulting layer, and
    a light emitting device,
    wherein the light shielding material is provided on a side of the insulating layer and around the light emitting device.

15. The display of claim 1, further comprising:
    a light emitting device,
    wherein the shielding material is provided at a height of the light emitting device.

16. A method of manufacturing a display comprising:
    forming a transistor positioned in a pixel region;
    forming a light shielding material positioned outside the pixel region, at least a portion of the light shielding material being positioned laterally with respect to the transistor to cover at least a part of a side face of the transistor thereby suppressing an incidence of light on the transistor; and
    forming a resin positioned outside the pixel region and the light shielding material such that the light shielding material is positioned between the transistor and the resin,
    wherein the light shielding material includes a plurality of recessed portions on an outer light incidence side of the light shielding material.

17. An electronic apparatus comprising:
a transistor positioned in a pixel region;
a light shielding material positioned outside the pixel region, at least a portion of the light shielding material being positioned laterally with respect to the transistor to cover at least a part of a side face of the transistor thereby suppressing an incidence of light on the transistor; and
a resin positioned outside the pixel region and the light shielding material such that the light shielding material is positioned between the transistor and the resin,
wherein the light shielding material includes a plurality of recessed portions on an outer light incidence side of the light shielding material.

18. The electronic apparatus of claim 17, further comprising:
a display.

19. The electronic apparatus of claim 18, wherein the display is any one of an OLED, electric paper, and a liquid crystal display.

* * * * *